US012787795B2

(12) United States Patent
Nah et al.

(10) Patent No.: US 12,787,795 B2
(45) Date of Patent: Nov. 3, 2026

(54) MODULAR PACKAGE STRUCTURES WITH INTERPOSERS HAVING ALIGNMENT FEATURES

(71) Applicant: International Business Machines Corporation, Armonk, NY (US)

(72) Inventors: Jae-Woong Nah, Closter, NJ (US); David Abraham, Croton, NY (US); John Michael Cotte, New Fairfield, CT (US); Muir Kumph, Croton-on-Hudson, NY (US)

(73) Assignee: International Business Machines Corporation, Armonk, NY (US)

(*) Notice: Subject to any disclaimer, the term of this patent is extended or adjusted under 35 U.S.C. 154(b) by 371 days.

(21) Appl. No.: 18/537,506

(22) Filed: Dec. 12, 2023

(65) Prior Publication Data

US 2025/0192064 A1 Jun. 12, 2025

(51) Int. Cl.
*H10W 46/00* (2026.01)
*H10W 70/05* (2026.01)
(Continued)

(52) U.S. Cl.
CPC .......... *H10W 46/00* (2026.01); *H10W 70/05* (2026.01); *H10W 70/611* (2026.01);
(Continued)

(58) Field of Classification Search
CPC ............... H10W 45/00; H10W 45/301; H10W 70/05; H10W 70/611; H10W 70/65;
(Continued)

(56) References Cited

U.S. PATENT DOCUMENTS 9,355,996 B2 * 5/2016 Haba .................. H10W 70/635
9,379,303 B2 6/2016 Gambetta et al.
(Continued)

FOREIGN PATENT DOCUMENTS

CN 115236807 A 10/2022
CN 116148990 A 5/2023
(Continued)

OTHER PUBLICATIONS

International Search Report and Written Opinion for International Application No. PCT/EP2024/085208 dated Mar. 10, 2022, 12 pages.
(Continued)

*Primary Examiner* — Dao H Nguyen
(74) *Attorney, Agent, or Firm* — Samuel Waldbaum; Ryan, Mason & Lewis, LLP

(57) ABSTRACT

A package structure comprises a first interposer, a second interposer, and a quantum chip. The first interposer comprises a first alignment feature. The second interposer comprises a second alignment feature. The quantum chip is bonded to the first interposer with an extended portion of the quantum chip extending past a first edge of the first interposer. The first interposer and the second interposer are disposed with the first alignment feature engaging with the second alignment feature to cause alignment and coupling of one or more components on the extended portion of the quantum chip with one or more components on the second interposer.

25 Claims, 16 Drawing Sheets

(51) Int. Cl.
*H10W 70/60* (2026.01)
*H10W 70/65* (2026.01)
*H10W 90/00* (2026.01)

(52) U.S. Cl.
CPC ........... *H10W 70/65* (2026.01); *H10W 90/00* (2026.01); *H10W 90/401* (2026.01); *H10W 46/301* (2026.01); *H10W 90/724* (2026.01)

(58) Field of Classification Search
CPC ............... H10W 90/00; H10W 90/401; H10W 90/724; H10W 72/07227; G06N 10/40
See application file for complete search history.

(56) References Cited

U.S. PATENT DOCUMENTS

| | | | | |
|---|---|---|---|---|
| 10,317,620 | B2 | 6/2019 | Rickman et al. | |
| 10,879,202 | B1 * | 12/2020 | Lewandowski | G06F 7/381 |
| 11,182,662 | B2 | 11/2021 | Lowe | |
| 11,195,773 | B2 | 12/2021 | Nah et al. | |
| 11,288,587 | B2 | 3/2022 | Paik et al. | |
| 11,362,257 | B2 | 6/2022 | Hidaka et al. | |
| 11,568,296 | B2 | 1/2023 | Shao et al. | |
| 11,581,292 | B2 | 2/2023 | Azeroual et al. | |
| 2014/0084454 | A1 | 3/2014 | Arnold et al. | |
| 2017/0373044 | A1 | 12/2017 | Das et al. | |
| 2018/0013052 | A1 * | 1/2018 | Oliver | H10N 60/12 |
| 2020/0044150 | A1 | 2/2020 | C et al. | |
| 2020/0161446 | A1 | 5/2020 | Anderson et al. | |
| 2023/0162080 | A1 * | 5/2023 | Kikuchi | G06N 10/40<br>716/100 |
| 2023/0359917 | A1 | 11/2023 | Abraham et al. | |
| 2023/0363294 | A1 | 11/2023 | Abraham et al. | |
| 2023/0363295 | A1 | 11/2023 | Abraham et al. | |
| 2024/0065116 | A1 * | 2/2024 | Ishihara | H01R 13/2421 |
| 2024/0104414 | A1 * | 3/2024 | Kumph | H01P 5/028 |

FOREIGN PATENT DOCUMENTS

| | | | |
|---|---|---|---|
| WO | 2018212041 | A1 | 11/2018 |
| WO | 2023/218303 | A1 | 11/2023 |

OTHER PUBLICATIONS

N. Leung et al., "Deterministic Bidirectional Communication and Remote Entanglement Generation between Superconducting Qubits," npj Quantum Information, Feb. 15, 2019, 5 pages, vol. 18.

A. Gold et al., "Entanglement Across Separate Silicon Dies in a Modular Superconducting Qubit Device," npj Quantum Information, Sep. 28, 2021, 10 pages, vol. 7.

* cited by examiner

MODULAR PACKAGE STRUCTURES WITH INTERPOSERS HAVING ALIGNMENT FEATURES

BACKGROUND

This disclosure relates generally to superconducting quantum computing systems and, in particular, techniques for packaging multiple chips with quantum bits to construct modular quantum processors or quantum computers. A quantum computing system can be implemented using superconducting circuit quantum electrodynamics (cQED) architectures that are constructed using quantum circuit components such as, e.g., superconducting quantum bits and other types of superconducting quantum devices that are controlled using microwave and/or flux bias control signals. In general, superconducting quantum bits (qubits) are electronic circuits which are implemented using components such as superconducting tunnel junctions (e.g., Josephson junctions), superconducting quantum interference devices (SQUIDs), inductors, and/or capacitors, etc., and which behave as quantum mechanical anharmonic (non-linear) oscillators with quantized states, when cooled to cryogenic temperatures.

As quantum processors are scaled with increasing numbers of superconducting qubits and higher integration densities, modular approaches are implemented in which a plurality of smaller, high-yielding chips with qubits are individually fabricated and packaged together to form larger-scale quantum processors. The smaller chips with qubits are easier to fabricate and can be screened for defects before being packaged together. While modular architectures allow larger superconducting quantum processors to be built from smaller modules, it is non-trivial to package individual chips with qubits together to provide modular package structures with proper alignment.

SUMMARY

Exemplary embodiments of the disclosure include package structures and techniques for constructing package structures by assembling modules (e.g., quantum computing modules) which comprise multiple quantum chips (having qubits) and package interposers having alignment features to enable alignment of the modules.

For example, an exemplary embodiment includes a package structure which comprises a first interposer, a second interposer, and a quantum chip. The first interposer comprises a first alignment feature. The second interposer comprises a second alignment feature. The quantum chip is bonded to the first interposer with an extended portion of the quantum chip extending past a first edge of the first interposer. The first interposer and the second interposer are disposed with the first alignment feature engaging with the second alignment feature to cause alignment and coupling of one or more components on the extended portion of the quantum chip with one or more components on the second interposer.

Advantageously, the alignment features of the interposers are configured to achieve accurate alignment of package components and modules with tight tolerances by physically abutting first and second interposers to engage the corresponding first and second alignment features. For example, the alignment features of the interposers enable accurate alignment and coupling of a quantum chip (or components thereof) on a first interposer with inter-chip coupling components (e.g., transmission lines) on a second interposer to achieve tight-tolerance alignment and coupling of quantum chips to the inter-chip coupling structures (e.g., alignment and coupling of qubits of the quantum chip on the first interposer to transmission lines on the second interposer).

In another exemplary embodiment, as may be combined with the preceding paragraphs, the first alignment feature comprises the first edge of the first interposer, and the second alignment feature comprises a second edge of the second interposer. The first edge and the second edge are abutted to cause the alignment and coupling of the one or more components on the extended portion of the quantum chip with the one or more components on the second interposer.

In another exemplary embodiment, as may be combined with the preceding paragraphs, the first alignment feature is fitted within the second alignment feature to cause the alignment and coupling of the one or more components on the extended portion of the quantum chip with the one or more components on the second interposer.

In another exemplary embodiment, as may be combined with the preceding paragraphs, the first alignment feature comprises a first pattern of alignment features, and the second alignment feature comprises a second pattern of alignment features. The first pattern of alignment features and the second pattern of alignment features are interdigitated to cause the alignment and coupling of the one or more components on the extended portion of the quantum chip with the one or more components on the second interposer.

Another exemplary embodiment includes a package structure which comprises a first interposer, a second interposer, and a first quantum chip. The first interposer comprises a first edge. The second interposer comprises a second edge. The first quantum chip is bonded to the first interposer with an extended portion of the first quantum chip extending past the first edge of the first interposer. The first interposer and the second interposer are disposed in a plane with the first edge and the second edge abutted to cause alignment and coupling of one or more components on the extended portion of the first quantum chip with one or more components on the second interposer.

In another exemplary embodiment, as may be combined with the preceding paragraphs, the first interposer comprises a first shape defined at least in part by the first edge, and the second interposer comprises a second shape defined at least in part by the second edge, wherein the first shape and the second shape are different shapes.

In another exemplary embodiment, as may be combined with the preceding paragraphs, the first interposer comprises a first shape defined at least in part by the first edge, and the second interposer comprises a second shape defined at least in part by the second edge, wherein the first shape and the second shape are the same shape.

In another exemplary embodiment, as may be combined with the preceding paragraphs, the second interposer comprises a second quantum chip, the one or more components on the second interposer comprise transmission lines coupled to the second quantum chip, and the one or more components on the extended portion of the first quantum chip comprise one or more quantum bits.

In another exemplary embodiment, as may be combined with the preceding paragraphs, the package structure further comprises a third interposer comprising a third edge. The first interposer comprises a second edge, and the first quantum chip is bonded to the first interposer with a second extended portion of the first quantum chip extending past the second edge of the first interposer. The third interposer is disposed on the plane with the first interposer and the second interposer. The second edge of the first interposer and the third edge of the third interposer are abutted to cause alignment and coupling of one or more components on the second extended portion of the first quantum chip with one or more components on the third interposer.

In another exemplary embodiment, as may be combined with the preceding paragraphs, the first interposer comprises a first shape defined at least in part by the first edge and the second edge of the first interposer, the second interposer comprises a second shape defined at least in part by the second edge of the second interposer, and the third interposer comprises a third shape defined at least in part by the third edge of the third interposer. The first shape, the second shape, and the third shape are the same shape.

In another exemplary embodiment, as may be combined with the preceding paragraphs, the first interposer comprises a first shape defined at least in part by the first edge and the second edge of the first interposer, the second interposer comprises a second shape defined at least in part by the second edge of the second interposer, and the third interposer comprises a third shape defined at least in part by the third edge of the third interposer. The second shape and the third shape are the same shape, and the first shape is different from the second and third shapes.

In another exemplary embodiment, as may be combined with the preceding paragraphs, the third interposer comprises a third quantum chip. The one or more components on the third interposer comprise transmission lines coupled to the third quantum chip, and the one or more components on the second extended portion of the first quantum chip comprise one or more quantum bits.

Another exemplary embodiment includes a package structure which comprises a first module and a second module. The first module comprises a first interposer which comprises a first edge, and a first quantum chip bonded to the first interposer with an extended portion of the first quantum chip extending past the first edge of the first interposer. The second module comprising a second interposer which comprises a second edge, a second quantum chip bonded to the second interposer, and transmission lines disposed on the second interposer and coupled to the second quantum chip. The first interposer and the second interposer are disposed in a plane with the first edge and the second edge abutted to cause alignment and coupling of one or more components on the extended portion of the first quantum chip with one or more of the transmission lines on the second interposer which are coupled to the second quantum chip.

Another exemplary embodiment includes a method which comprises: forming interposers on a substrate; and cutting the substrate to separate the interposers into at least a first interposer comprising a first edge, and a second interposer comprising a second edge. The first edge and the second edge are configured to cause alignment of structures on the first interposer with structures on the second interposer when the first edge and the second edge are abutted with the first interposer and the second interposer disposed in a plane.

Another exemplary embodiment includes a method which comprises: constructing a first module comprising a first interposer which comprises a first edge, and a first quantum chip bonded to the first interposer with an extended portion of the first quantum chip extending past the first edge of the first interposer; constructing a second module comprising a second interposer which comprises a second edge, a second quantum chip bonded to the second interposer, and transmission lines disposed on the second interposer and coupled to the second quantum chip; and assembling the first module and the second module with the first interposer and the second interposer are disposed in a plane with the first edge and the second edge abutted to cause alignment and coupling of one or more components on the extended portion of the first quantum chip with one or more of the transmission lines on the second interposer which are coupled to the second quantum chip.

Other embodiments will be described in the following detailed description of exemplary embodiments, which is to be read in conjunction with the accompanying figures.

DETAILED DESCRIPTION

Figure 1:
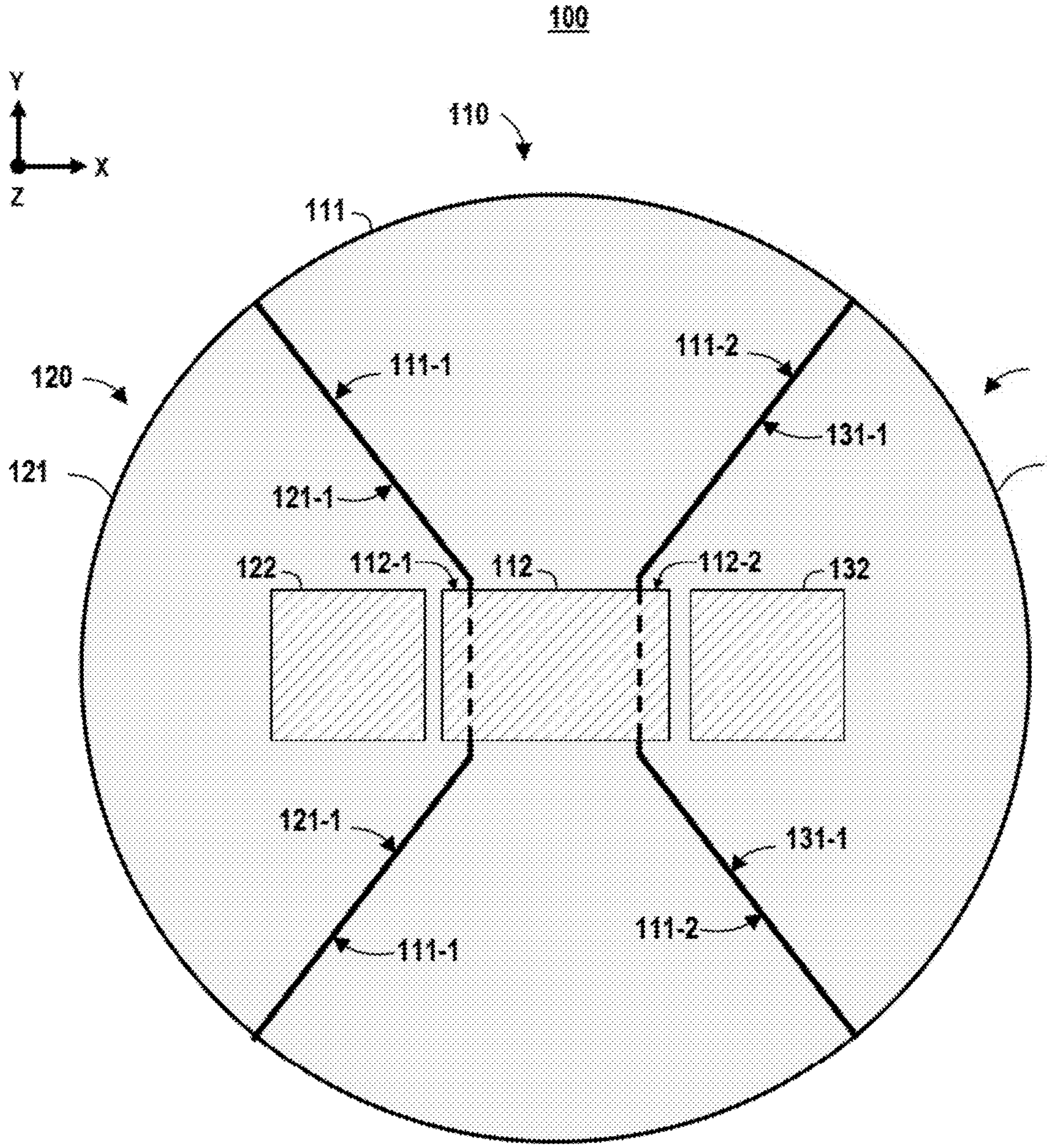
FIG. 1 schematically illustrates a modular package structure, according to an exemplary embodiment of the disclosure.

Exemplary embodiments of the disclosure will now be described in further detail with regard to modular package structures and techniques for constructing modular package structures using quantum modules having package interposers that are designed with alignment features. The alignment features are configured to enable tight tolerance-alignment of two or more interposers that are disposed on a same plane (e.g., X-Y plane) by physically engaging the alignment features of the interposers to cause alignment of one or more structures on one interposer with one or more structures on another interposer, wherein such tight tolerance-alignment is achieved in first and second orthogonal lateral directions (e.g., X and Y directions) of the plane (X-Y plane).

It is to be understood that the various features shown in the accompanying drawings are schematic illustrations that are not drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the term "exemplary" as used herein means "serving as an example, instance, or illustration." Any embodiment or design described herein as "exemplary" is not to be construed as preferred or advantageous over other embodiments or designs.

Further, it is to be understood that the phrase "configured to" as used in conjunction with a circuit, structure, element, component, or the like, performing one or more functions or otherwise providing some functionality, is intended to encompass embodiments wherein the circuit, structure, element, component, or the like, is implemented in hardware, software, and/or combinations thereof, and in implementations that comprise hardware, wherein the hardware may comprise quantum circuit elements (e.g., quantum bits, tunable couplers, etc.), discrete circuit elements (e.g., transistors, inverters, etc.), programmable elements (e.g., application specific integrated circuit (ASIC) chips, field-programmable gate array (FPGA) chips, etc.), processing devices (e.g., central processing units (CPUs), graphics processing units (GPUs), etc.), one or more integrated circuits, and/or combinations thereof. Thus, by way of example only, when a circuit, structure, element, component, etc., is defined to be configured to provide a specific functionality, it is intended to cover, but not be limited to, embodiments where the circuit, structure, element, component, etc., is comprised of elements, processing devices, and/or integrated circuits that enable it to perform the specific functionality when in an operational state (e.g., connected or otherwise deployed in a system, powered on, receiving an input, and/or producing an output), as well as cover embodiments when the circuit, structure, element, component, etc., is in a non-operational state (e.g., not connected nor otherwise deployed in a system, not powered on, not receiving an input, and/or not producing an output) or in a partial operational state.

To provide spatial context to the different structural orientations of the semiconductor structures shown in the drawings, XYZ Cartesian coordinates are shown in the drawings. The terms "vertical" or "vertical direction" or "vertical height" as used herein denote a Z-direction of the Cartesian coordinates shown in the drawings, and the terms "horizontal," "horizontal direction," "lateral," or "lateral direction" as used herein denote an X-direction and/or a Y-direction of the Cartesian coordinates shown in the drawings.

In addition, the term "quantum chip" as used herein refers to a die (e.g., semiconductor die) which comprises a superconducting electronic integrated circuit comprising various superconducting components such as qubits, tunable couplers, ground planes, signal coplanar waveguides, and resonators, etc. A plurality of dies having the same and/or different configurations of superconducting electronic integrated circuits, can be fabricated on a wafter (e.g., semiconductor wafer), wherein the individual dies can be diced (cut) from the wafer using a die singulation process to provide singulated dies which can be packaged together to construct a modular quantum processor architecture. The terms "quantum chip" and "quantum die" are synonymous terms and used interchangeably herein. The terms "quantum computing module" or "quantum module" or "module" as used herein are synonymous terms that refer to an assembly of an interposer having one or more quantum chips bonded to the interposer. Moreover, the terms "non-galvanic coupling" or "non-galvanic connection" as used herein refer to non-direct electrical connections, e.g., a connection that is achieved via capacitive coupling, inductive coupling, optical coupling, combinations thereof, etc.

FIG. 1 schematically illustrates a modular package structure, according to an exemplary embodiment of the disclosure. More specifically, FIG. 1 is a schematic top view of a modular package structure 100 which comprises a plurality of quantum modules including a first module 110, a second module 120, and a third module 130. The first module 110 comprises a first interposer 111 and a quantum chip 112 bonded to a surface of the first interposer 111. The first interposer 111 comprises a first edge 111-1 and a second edge 111-2. The second module 120 comprises a second interposer 121 and a quantum chip 122 bonded to a surface of the second interposer 121. The second interposer 121 comprises a first edge 121-1. The third module 130 comprises a third interposer 131 and a quantum chip 132 bonded to a surface of the third interposer 131. The third interposer 131 comprises a first edge 131-1.

As further shown in FIG. 1, the quantum chip 112 comprises a first portion 112-1 (alternatively referred to herein as first extended portion) which extends past the first edge 111-1 of the first interposer 111 and overlaps a portion of the second interposer 121. In addition, the quantum chip 112 comprises a second portion 112-2 (alternatively referred to herein as second extended portion) which extends past the second edge 111-2 of the first interposer 111 and overlaps a portion of the third interposer 131. The first extended portion 112-1 comprises one or more components that are aligned with and coupled to one or more components on the second interposer 121. The second extended portion 112-1 comprises one or more components that are aligned with and coupled to one or more components on the third interposer 131.

For example, in some embodiments, the first extended portion 112-1 comprises one or more qubits that are aligned with and capacitively coupled to one or more transmission lines on the second interposer 121. Similarly, in some embodiments, the second extended portion 112-2 comprises one or more qubits that are aligned with and capacitively coupled to one or more transmission lines on the third interposer 131. In some embodiments, the capacitive coupling of the components (e.g., qubits) on the quantum chip 112 with components (e.g., transmission lines) on the second and third interposers 121 and 131 provide non-galvanic connections that permit the coupling of the quantum chips to the second and third interposers 121 and 131 without additional bonding steps, giving greater flexibility in assembling modular quantum processors comprising a plurality of individual quantum chips which are mounted on different interposers, and operatively coupled together to implement modular package structures with large arrays of quantum bits.

FIG. 1 illustrates an exemplary embodiment in which tight tolerance-alignment of the first module 110 and the second module 120 is achieved by abutting the first edge 111-1 of the first interposer 111 with the first edge 121-1 of the second interposer 121. In addition, tight tolerance-alignment of the first module 110 and the third module 130 is achieved by abutting the second edge 111-2 of the first interposer 111 with the first edge 131-1 of the third interposer 131. In the exemplary embodiment of FIG. 1, the first interposer 111, the second interposer 121, and the third interposer 131 are disposed on the same plane (X-Y plane). In the exemplary package configuration, the first edge 111-1 of the first interposer 111 and the first edge 121-1 of the second interposer 121 comprise corresponding alignment features that are engaged (e.g., physically abutted) to cause alignment of, e.g., qubits on the first extended portion 112-1 of the quantum chip 112 with, e.g., transmission lines the overlapped region of the second interposer 121 (e.g., tight tolerance-alignment achieved in the X and Y (orthogonal) lateral directions of the X-Y plane) to thereby enable proper alignment of the quantum chip 112 of the first module 110 to the second module 120. Similarly, the second edge 111-2 of the first interposer 111 and the first edge 131-1 of the third interposer 131 comprise corresponding alignment features that are engaged (e.g., physically abutted) to cause alignment of, e.g., qubits on the second extended portion 112-2 of the quantum chip 112 with, e.g., transmission lines in the overlapped region of the third interposer 131 (e.g., self-alignment achieved in the X and Y (orthogonal) lateral directions of the X-Y plane) to thereby enable proper alignment of the quantum chip 112 of the first module 110 to the third module 130.

Figure 2A:
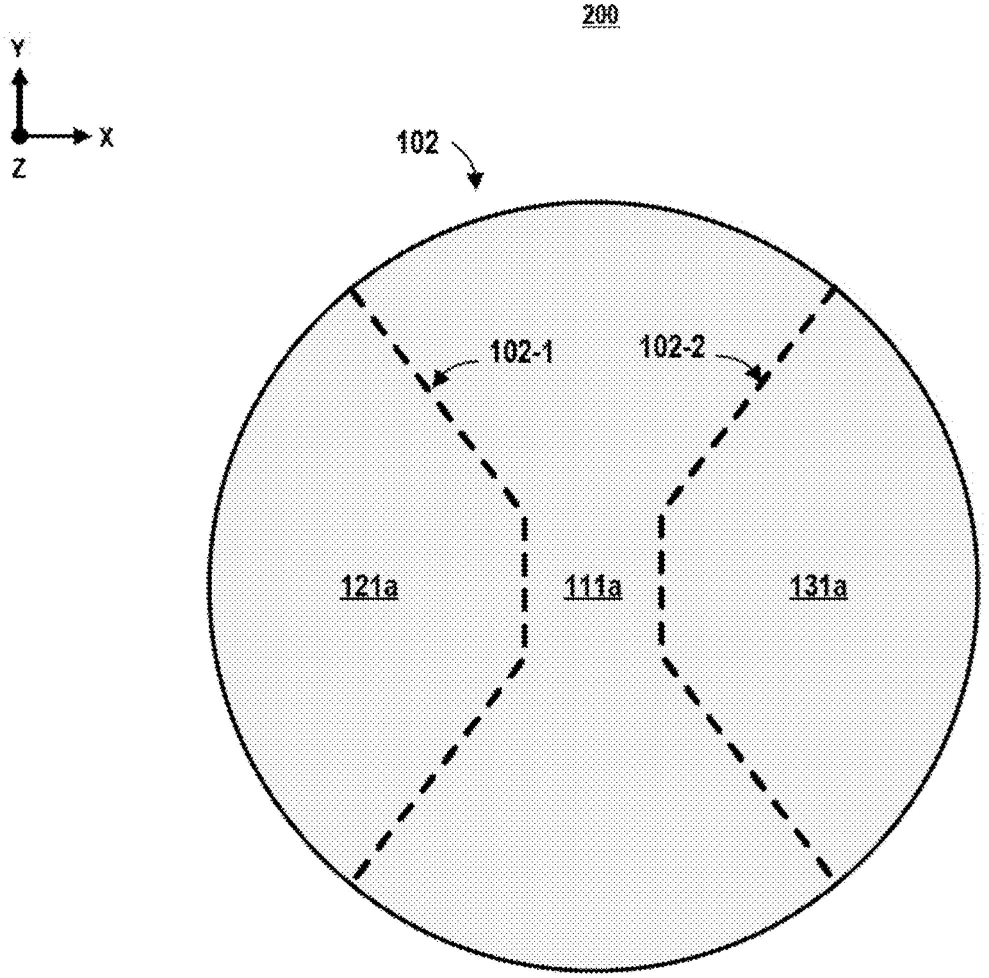
FIGS. 2A, 2B, and 2C schematically illustrate a method for constructing a modular package structure, according to an exemplary embodiment of the disclosure.
Figure 2B:
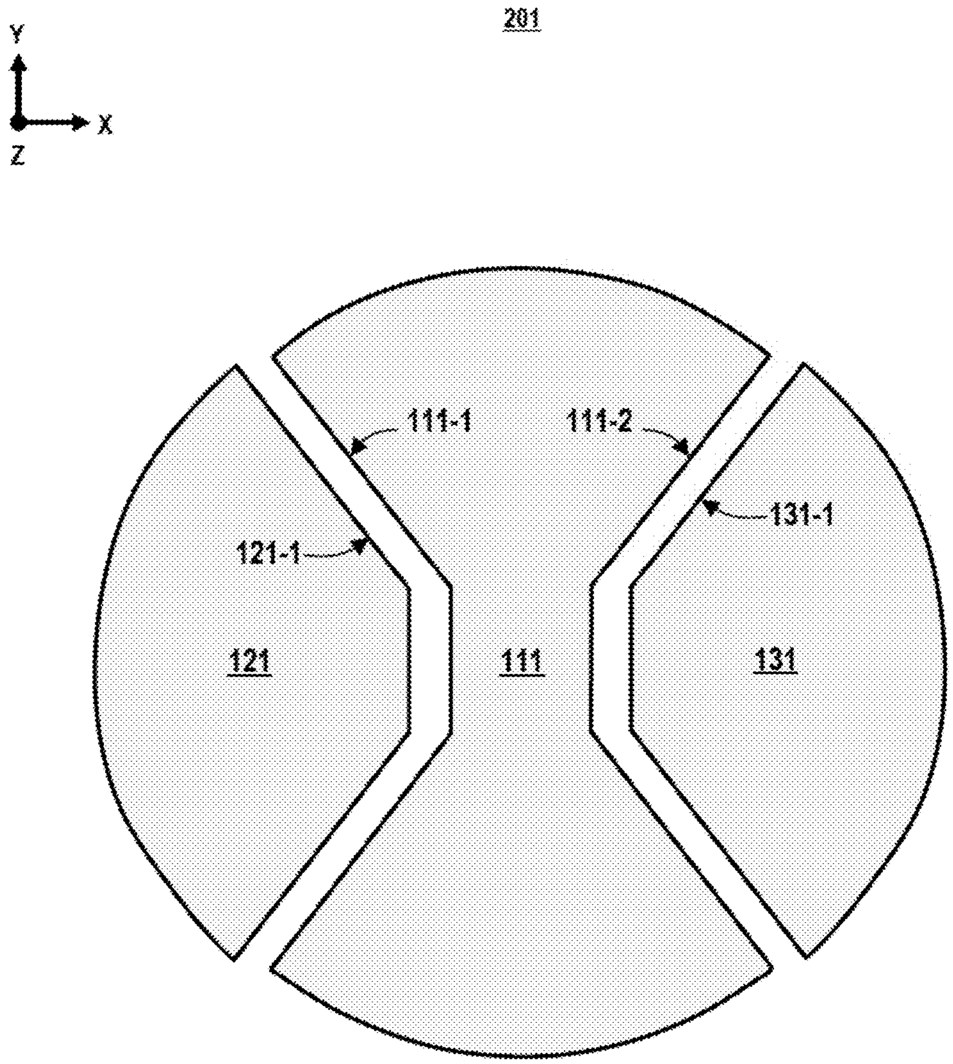
Figure 2C:
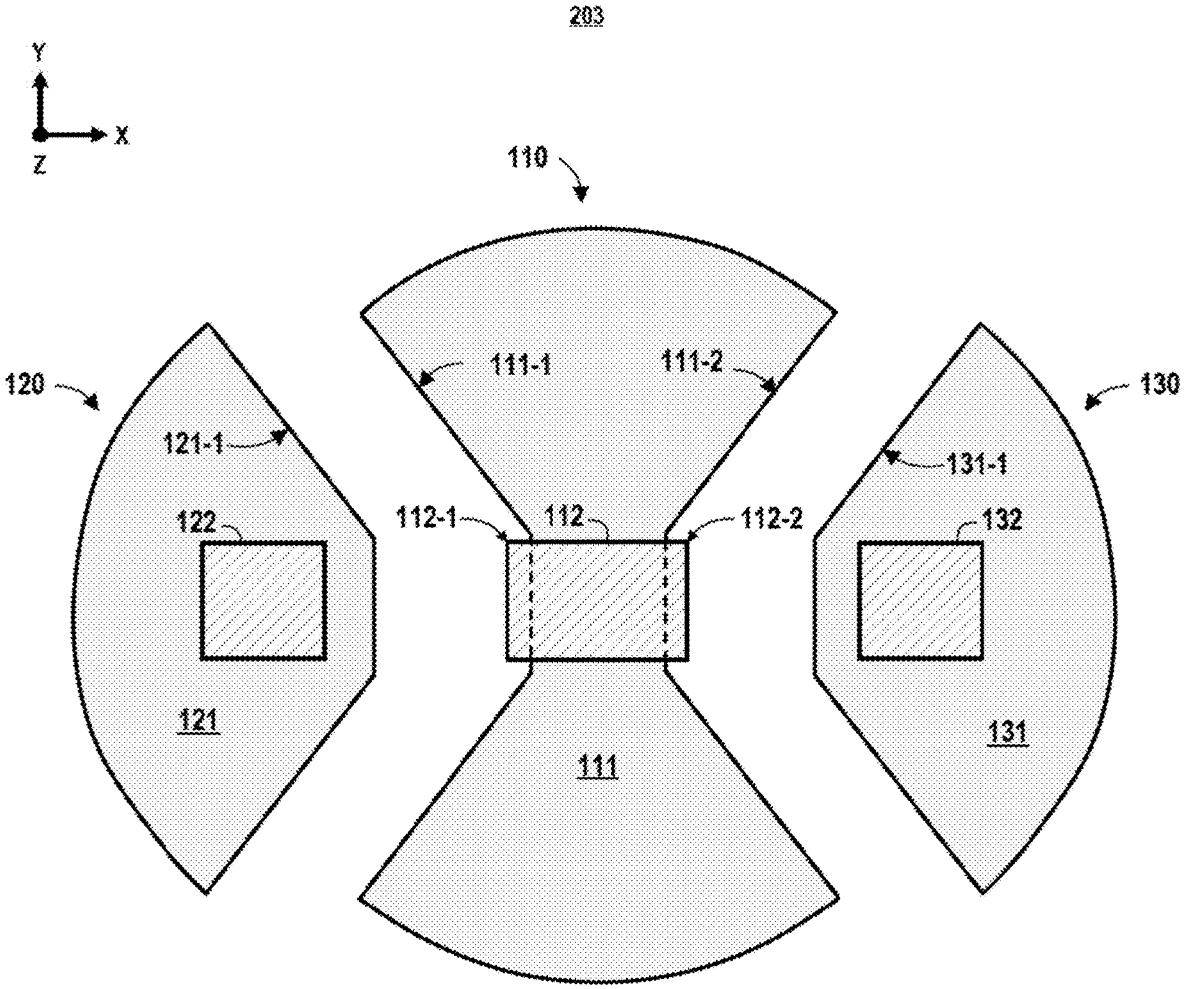

FIGS. 2A, 2B, and 2C schematically illustrate a method for constructing a modular package structure, according to an exemplary embodiment of the disclosure. In particular, FIGS. 2A, 2B, and 2C schematically illustrate a method for fabricating the exemplary modular package structure 100 of FIG. 1. FIG. 2A illustrates an initial phase 200 of the fabrication process starting with a substrate 102 that is segmented (or delineated) into a first region 111*a*, a second region 121*a*, and a third region 131*a*, based on a first dicing line 102-1, and a second dicing line 102-2. The first, second, and third regions 111*a*, 121*a*, and 131*a* correspond to the respective first, second, and third interposers 111, 121, and 131.

The substrate 102 is formed of any suitable material for forming quantum hardware chips, such as single crystal silicon (Si), silicon germanium (SiGe), sapphire, glass, etc. The lateral (X-Y) dimensions of the substrate 102 can depend on the size, number, and/or layout of the interposers needed to construct a given package structure. For example, in an exemplary non-limiting embodiment, the substrate 102 can be a semiconductor wafer, e.g., a 300 mm diameter silicon wafer (12-inch diameter silicon wafer) having a thickness in a range of 10 microns to 1000 microns, or a panel, e.g., an 800×800 mm square panel having a thickness in a range of 10 microns to 1000 microns.

A metallization process is performed to form patterned metallization structures on the surface of the substrate 102 in the different interposer regions 111*a*, 121*a*, and 131*a*, as desired for a given package design. The metallization process involves depositing and patterning metal/metallic material to form planar transmission lines (for data signals and control signals), ground planes, chip bonding pads, and other patterned metallic elements which are formed for superconducting quantum computing applications. The metal/metallic materials include superconducting metal/metallic material including, but are not limited to, niobium, aluminum, titanium, tungsten, molybdenum, nitrides of the same, a combination thereof, and/or the like. A superconducting material is any material that exhibits superconducting properties (e.g., no electrical resistance, expels magnetic fields when in a superconducting state) at or below a superconducting critical temperature.

In some embodiments, the metallization that is formed on the surface of the substrate 102 comprises a single-level wiring network. In other embodiments, to support higher integration densities, the metallization can be multi-level wiring structure formed on the surface of the substrate 102, wherein the multi-level wiring structure comprises multiple levels of patterned superconducting metallization, dielectric layers, and inter-level metallic vias, which can be fabricated using, e.g., back-end-of-line (BEOL) processes, which are typically utilized to construct wiring network structures on active surfaces of semiconductor chips.

Furthermore, in some embodiments, the holes can be drilled in regions of the substrate 102 to provide through holes for mounting a plurality of connectors (e.g., clamp on connector) to the surface of the substrate 102. For example, the through holes in the substrate 102 can be formed using a precision machined backer plate that is placed on the surface of the substrate 102, and having various shapes openings that correspond to shapes and opening to be cut into the substrate 102 to facilitate the mounting of connectors as well as precision placement of the substrate 102 to a base plate.

Next, FIG. 2B schematically illustrates a result of a dicing process 201 in which the substrate 102 is cut along the first dicing line 102-1 and the second dicing line 102-2 shown in FIG. 2A to separate the first, second, and third interposer regions 111*a*, 121*a*, and 131*a* into the respective individual first, second, and third interposers 111, 121, and 131, each having associated metallization and cut shapes/openings for mounting connectors thereto. In some embodiments, the dicing process is performed using a state-of-the art water jet-guided laser process for precision cutting, or other suitable wafer dicing processes. The cutting along the first dicing line 102-1 singulates the second interposer 121 from the substrate 102, and the cutting along the second dicing line 102-2 singulates the first interposer 111 and the third interposer 131 from the substrate 102. In the exemplary embodiment, total area of the first, second, and third interposers 111, 121, and 131 collect includes essentially an entire area of the original substrate 102.

As schematically illustrated in FIG. 2B, the cutting along the first dicing line 102-1 results in the formation of the first edge 111-1 of the first interposer 111, and the first edge 121-1 of the second interposer 121, wherein such edges 111-1 and 121-1 comprise corresponding alignment features (e.g., alignment edges) that are concurrently formed as a result of the dicing, which enable tight tolerance-alignment of the first and second interposers 111 and 121 in the X and Y lateral directions by physically abutting the edges 111-1 and 121-1 in an interlocking manner. Similarly, the cutting along the second dicing line 102-2 results in the formation of the second edge 111-2 of the first interposer 111, and the first edge 131-1 of the third interposer 131, wherein such edges 111-2 and 131-1 comprise corresponding alignment features (e.g., alignment edges) that are concurrently formed as a result of the cutting process, which enable tight tolerance-alignment of the first and third interposers 111 and 131 in the X and Y lateral directions by physically abutting the edges 111-1 and 131-1 in an interlocking manner.

FIG. 2B illustrates an exemplary embodiment in which the first interposer 111 comprises a first shape that is defined at least in part by the first edge 111-1 and the second edge 111-2 thereof. In addition, the second interposer 121 comprises a second shape defined at least in part by the first edge 121-1 thereof, wherein the first and second shapes of the first and second interposers 111 and 121 are different. Further, the third interposer 131 comprises a third shape that is defined at least in part by the first edge 131-1 thereof, wherein the shapes of the second and third interposers 121 and 131 are the same shape.

Next, FIG. 2C schematically illustrates a process of constructing a plurality of quantum modules by bonding one or more quantum chips to each of the singulated first, second, and third interposers 111, 121, and 131. In particular, in the exemplary embodiment of FIG. 2C, the first module 110 is formed by bonding the quantum chip 112 to bonding pads on the first interposer 111, the second module 120 is formed by bonding the quantum chip 122 to bonding pads on the second interposer 121, and the third module 120 is formed by bonding the quantum chip 132 to bonding pads on the third interposer 131. The quantum chip 112 is bonded to the first interposer 111 with the first portion 112-1 extending past the first edge 111-1 of the first interposer 111, and with the second portion 112-2 extending past the second edge 111-2 of the first interposer 111.

In some embodiments, the quantum chips 112, 122, and 132 are flip-chip bonded to the respective interposers 111, 121, and 131 using solder bumps 140 (e.g., indium solder bumps). While the exemplary modules 110, 120, and 130 are each shown to be constructed with a single quantum chip, it is to be understood that quantum modules can be fabricated to have two or mor quantum chips, depending on the application. The quantum chips 112, 122, and 132 each comprise superconducting electronic integrated circuitry comprising various superconducting components such as qubits, tunable couplers, ground planes, signal coplanar waveguides, and readout resonators, etc. The qubits can include various types of superconducting qubits such as transmon qubits, fluxonium qubits, multimode qubits (e.g., two-junction qubits, or tunable coupling qubits), and other suitable types of fixed-frequency qubits or tunable-frequency qubits. The tunable couplers can be implemented using a frequency-tunable qubits which do not encode quantum information, but which serve to control/mediate interactions (e.g., entanglement gate operations) between superconducting qubits.

The first module 110, the second module 120, and the third module 130 are then assembled together to construct the exemplary package structure 100, such as shown in FIG. 1. As noted above, the first module 110, the second module 120, and the third module 130 are assembled by a process which comprises disposing the module 110, 120, and 130 adjacent to each other in a same plane, and causing (i) tight tolerance alignment of the first module 110 and the second module 120 by abutting the first edge 111-1 of the first interposer 111 with the first edge 121-1 of the second interposer 121, and (ii) tight tolerance-alignment of the first module 110 and the third module 130 by abutting the second edge 111-2 of the first interposer 111 with the first edge 131-1 of the third interposer 131. The edges 111-1 and 121-1 of the first and second interposers 111 and 121 comprise corresponding alignment edges that are engaged (e.g., physically abutted) to cause tight accuracy-alignment of components (e.g., qubits) on the first extended portion 112-1 of the quantum chip 112 with components (e.g., transmission lines) on the second interposer 121. Similarly, the edges 111-2 and 131-1 of the first and third interposers 111 and 131 comprise corresponding alignment edges that are engaged (e.g., physically abutted) to cause tight accuracy-alignment of components (e.g., qubits) on the second extended portion 112-2 of the quantum chip 112 with components (e.g., transmission lines) on the third interposer 131. In this configuration, the components (e.g., qubits) on the first and the second extended portions 112-1 and 112-2 of the quantum chip 112 are aligned to respective components (e.g., transmission lines), with tight accuracy in both X and Y lateral directions in the X-Y plane, on the second and third interposers 121 and 131 to thereby enable proper alignment and coupling of the quantum chip 112 of the first module 110 to the second and third modules 120 and 130.

Figure 3A:
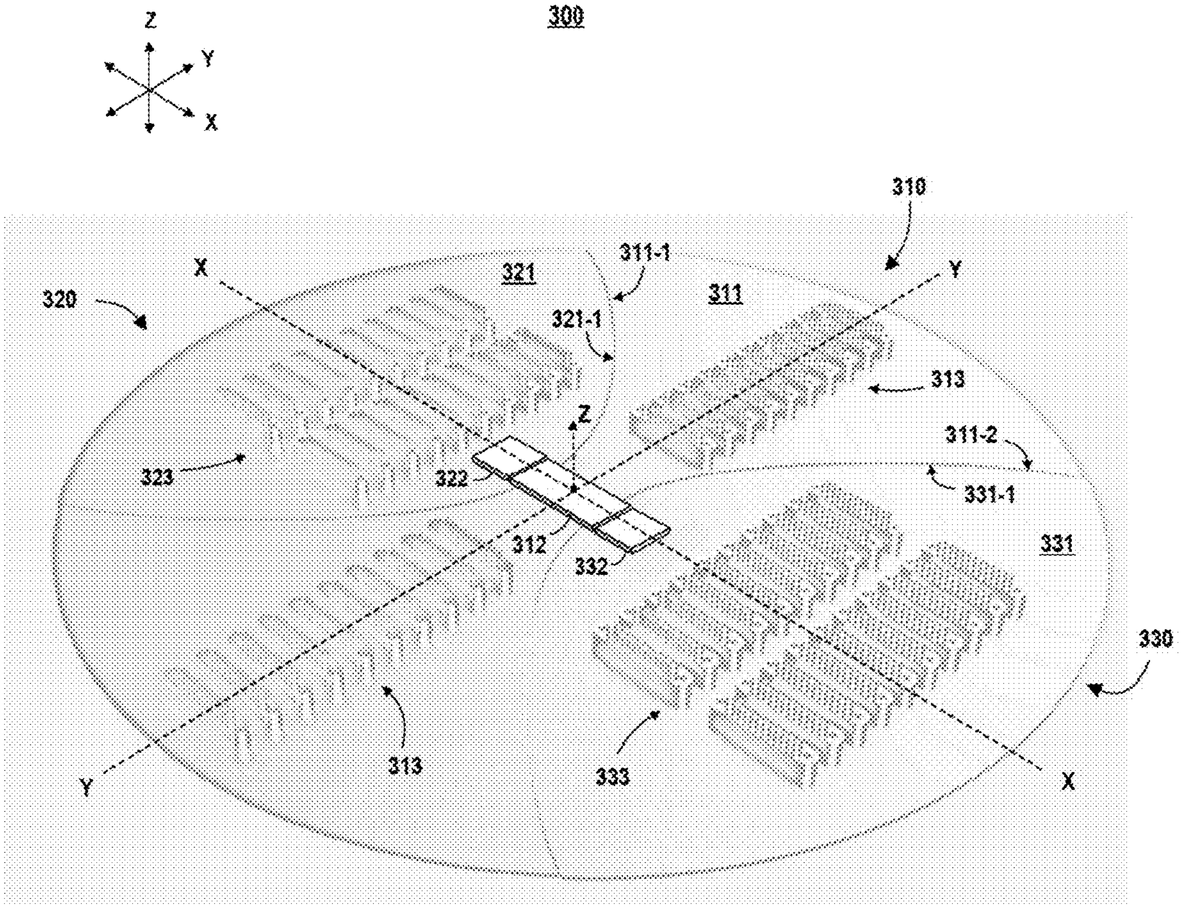
FIGS. 3A and 3B schematically illustrate a modular package structure, according to another exemplary embodiment of the disclosure.
Figure 3B:
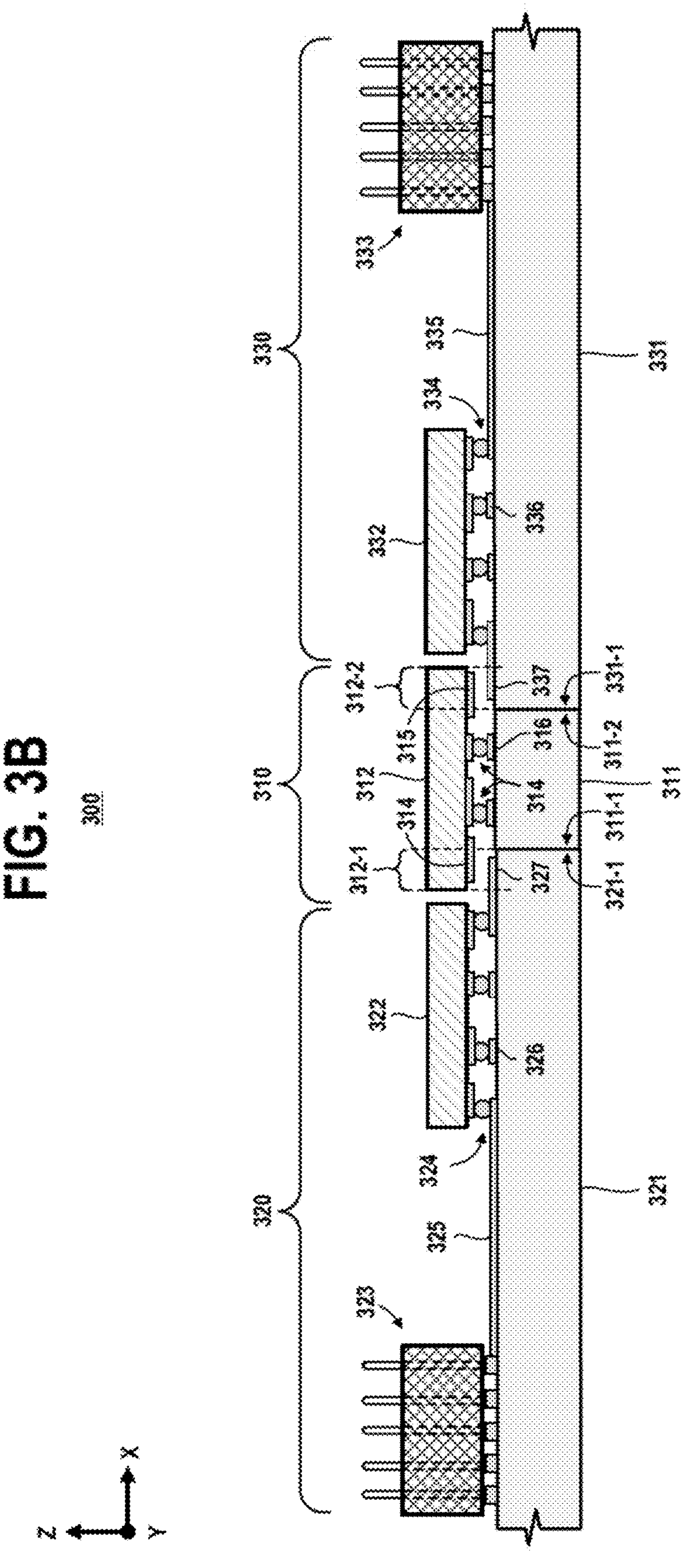

FIGS. 3A and 3B schematically illustrate a modular package structure, according to another exemplary embodiment of the disclosure. In particular, FIG. 3A is a schematic perspective view of a modular package structure 300, and FIG. 3B is a schematic cross-sectional view of the modular package structure 300 along a portion of line X-X in FIG. 3A. The modular package structure 300 comprises a plurality of quantum modules including a first module 310, a second module 320, and a third module 330. The first module 310 comprises a first interposer 311 and a quantum chip 312 bonded to a surface of the first interposer 311. The first interposer 311 comprises a first edge 311-1 and a second edge 311-2. The second module 320 comprises a second interposer 321 and a quantum chip 322 bonded to a surface of the second interposer 321. The second interposer 321 comprises a first edge 321-1. The third module 330 comprises a third interposer 331 and a quantum chip 332 bonded to a surface of the third interposer 311. The third interposer 331 comprises a first edge 331-1.

The exemplary modular package structure 300 is similar in architecture to the modular package structure 100 of FIG. 1 in that the first, second, and third interposers 311, 321, and 331 comprise the same or similar shapes as the first, second, and third interposers 111, 121, and 131 interposers of the modular package structure 100. In addition, similar to the quantum chip 112 as shown in FIG. 1, the quantum chip 312 comprises a first extended portion 312-1 which extends past the first edge 311-1 of the first interposer 311 and overlaps a portion of the second interposer 321. In addition, the quantum chip 312 comprises a second extended portion 312-2 which extends past the second edge 311-2 of the first interposer 311 and overlaps a portion of the third interposer 331.

The exemplary modular package structure 300 further comprises a plurality of connectors 313 mounted on the surface of the first interposer 311, a plurality of connectors 323 mounted on the surface of the second interposer 321, and a plurality of connectors 333 mounted on the surface of the third interposer 331. The connectors 313 are configured to enable the transmission of I/O signals (data and control signals) between the quantum chip 312 on the first interposer 311 and a remote computing system or control electronics. Similarly, the connectors 323 are configured to enable the transmission of I/O signals (data and control signals) between the quantum chip 322 on the second interposer 321 and the remote computing system or control electronics. In addition, the connectors 333 are configured to enable the transmission of I/O signals (data and control signals) between the quantum chip 332 on the third interposer 331 and the remote computing system or control electronics. The connectors 322 and 333 can be implemented using any type of connector that is suitable for superconducting quantum computing.

FIG. 3B schematically illustrates an exemplary embodiment in which quantum chips 312, 322, and 332 are flip-chip bonded to the respective interposers 311, 321, and 331 using respective arrays of solder bump connections 314, 324 and 334. In addition, the modular package structure 300 comprises various metallization on the surfaces of the first, second, and third interposers 311, 321, and 331 including, but not limited to, planar signal transmission lines 325 and 335 (e.g., coplanar waveguides (CPWs)) which are configured to transmit I/O signals between the quantum chips (e.g., quantum chips 322 and 332) and the connectors (e.g., connectors 323 and 333, as specially shown in FIG. 3B) on the corresponding interposers (e.g., second and third interposers 321 and 331, as specifically shown in FIG. 3B).

In addition, FIG. 3B schematically illustrates that the first extended portion 312-1 of the quantum chip 312 overlaps a portion of the second interposer 321. The first extended portion 312-1 comprises metallization 314 which is aligned with, and capacitively coupled to, metallization 327 on the second interposer 321 by abutting the edges 311-1 and 321-1 of the first and second interposers 311 and 321, as shown. Further, the second extended portion 312-2 of the quantum chip 312 is shown to overlap a portion of the third interposer 331. The second extended portion 312-1 comprises metallization 315 which is aligned with, and capacitively coupled to, metallization 337 on the third interposer 331 by abutting the edges 311-2 and 331-1 of the first and third interposers 311 and 331, as shown. In some embodiments, the metallization 314 and 315 of the first and second extended portions 312-1 and 312-2 comprises quantum components such as qubits, and the metallization 327 and 337 on the second and third interposers 321 and 331 comprise transmission lines that are non-galvanically coupled to the qubits via vacuum gap capacitor structures.

Figure 4A:
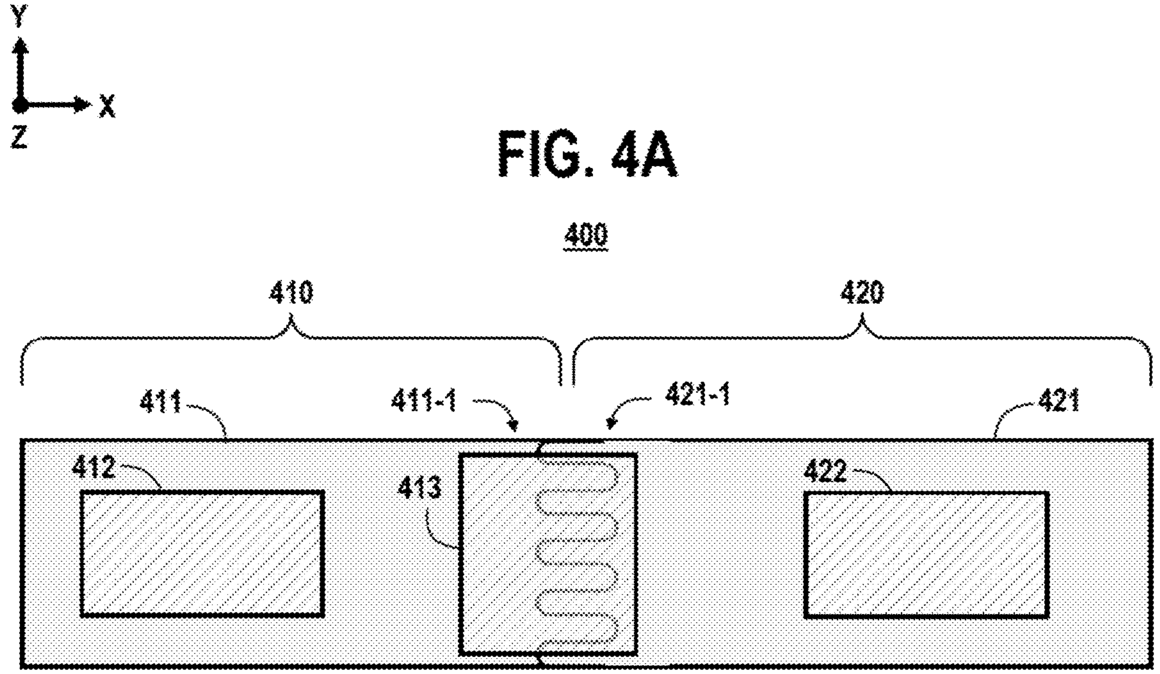
FIG. 4A schematically illustrates a modular package structure, according to another exemplary embodiment of the disclosure.

FIG. 4A schematically illustrates a modular package structure, according to another exemplary embodiment of the disclosure. More specifically, FIG. 4A is a schematic top view of a modular package structure 400 which comprises a plurality of quantum modules including a first module 410 and a second module 420. The first module 410 comprises a first interposer 411, a first quantum chip 412 bonded to a surface of the first interposer 411, and a second quantum chip 413 that is bonded to the surface of the first interposer 411. The second module 420 comprises a quantum chip 422 bonded to a surface of the second interposer 421. The second quantum chip 413 of the first module 410 overlaps and is coupled to a portion of the second interposer 421.

FIG. 4A schematically illustrates an exemplary embodiment in which the first interposer 411 comprises a first alignment features 411-1, and the second interposer 421 comprises a second alignment feature 421-1. The first alignment feature 411-1 comprises a first pattern of features (e.g., a first pattern of finger-shaped elements and grooves), and the second alignment feature 421-1 comprises a second pattern of features (e.g., a second pattern of finger-shaped elements and grooves), which have corresponding opposing patterns that are interdigitated to interlock abutting edges of the first and second interposers 411 and 421 and cause the alignment of the one or more structures on the first interposer 411 with one or more structures on the second interposer 421.

Figure 4B:
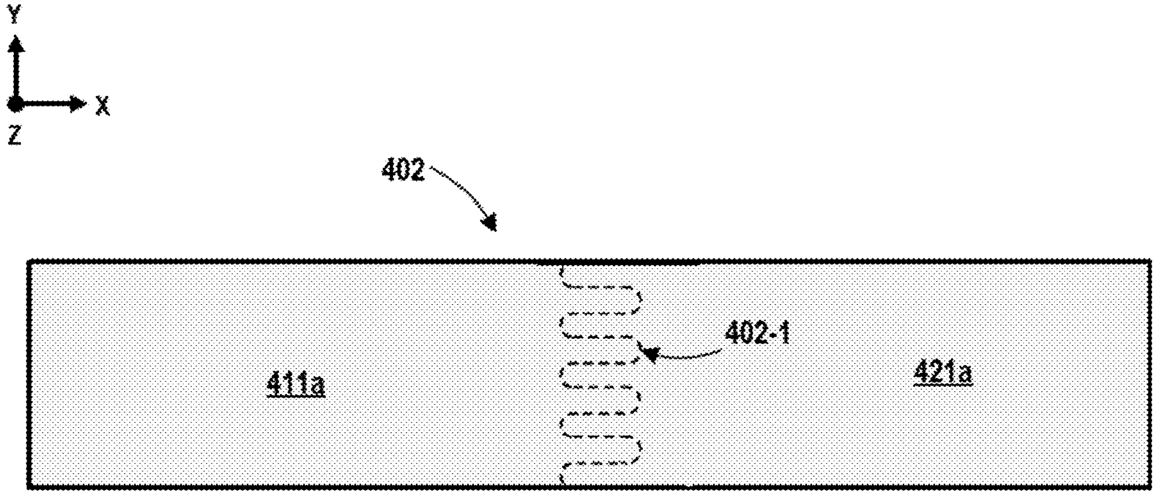
FIGS. 4B, 4C, and 4D schematically illustrate a method for constructing a modular package structure, according to another exemplary embodiment of the disclosure.
Figure 4C:
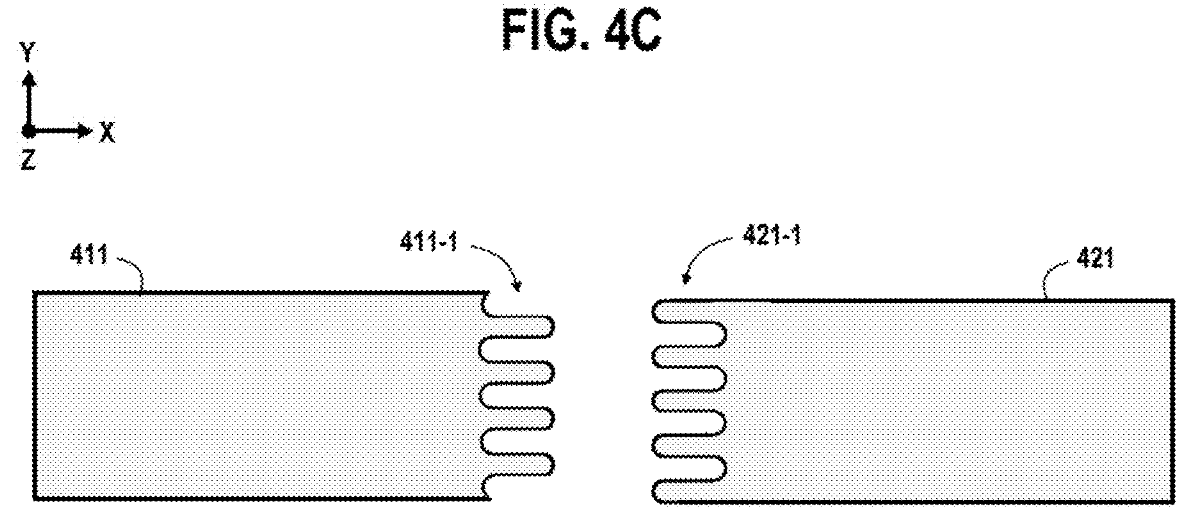
Figure 4D:
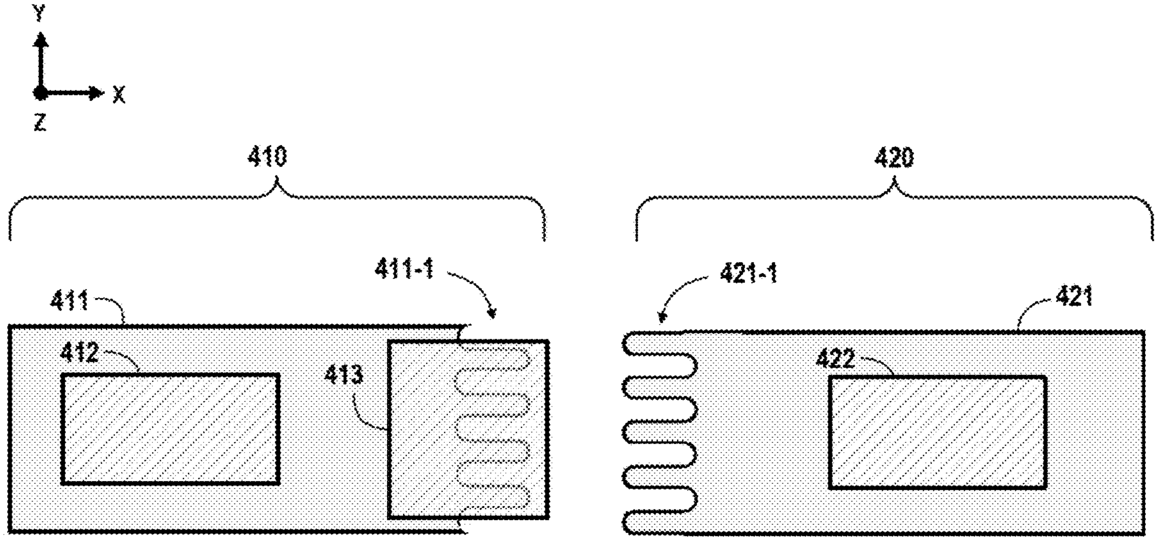

FIGS. 4B, 4C, and 4D schematically illustrate a method for constructing the modular package structure 400 of FIG. 4A, according to another exemplary embodiment of the disclosure. FIG. 4B schematically illustrates an initial phase of the fabrication process starting with a substrate 402 (e.g., a portion of a semiconductor wafer) that is segmented (or delineated) into a first region 411*a* and a second region 421*a*, based on a dicing line 402-1. The first and second regions 411*a* and 421*a* correspond to the respective first and second interposers 411 and 421. The substrate 402 may comprise a silicon substrate or other type of material as discussed above. A metallization process is performed to form patterned metallization structures on the surface of the substrate 402 in the different interposer regions 411*a* and 421*a*, as desired for a given package design.

Next, FIG. 4C schematically illustrates a result of a dicing process in which the substrate 402 is cut along the dicing line 402-1 to separate the first and second interposer regions 411*a* and 421*a* into the respective individual first and second interposers 411 and 421. The cutting along the dicing line 402-1 results in the formation of the first alignment feature 411-1 of the first interposer 411, and the corresponding second alignment feature 421-1 of the second interposer 421. The first alignment feature 411-1 comprises a first pattern of finger-shaped elements and grooves, which form a first meandering edge of the first interposer 411. The second alignment feature 421-1 comprises a second pattern of finger-shaped elements and grooves, which form a second meandering edge of the second interposer 421. The first and second alignment features 411-1 and 421-1 have corresponding opposing patterns of fingers and grooves that are interdigitated (or interlaced) and interlocked by abutting the first and second meandering edges of the first and second interposers 411 and 421, to thereby cause the alignment of one or more structures on the first interposer 411 with one or more structures on the second interposer 421. The corresponding first and second alignment features 411-1 and 421-1 are concurrently formed as a result of the cutting the substrate 402 along the dicing line 402-1, which enables tight tolerance-alignment of the first and second interposers 411 and 421 in the X and Y lateral directions by interlacing the corresponding fingers and grooves of the first and second alignment features 411-1 and 421-1 in an interlocking manner, and abutting the first and second meandering edges of the first and second interposers 411 and 421.

Next, FIG. 4D schematically illustrates a process of constructing the first and second quantum modules 410 and 420 by bonding one or more quantum chips to each of the singulated first and second interposers 411 and 421. In particular, in the exemplary embodiment of FIG. 4D, the first module 410 is formed by bonding the first quantum chip 412 to bonding pads on the first interposer 411 and bonding the second quantum chip 413 to bonding pads on the first interposer 411 including bonding pads that are located on one or more of the finger elements of the first alignment features 411-1. The second module 420 is formed by bonding the quantum chip 422 to bonding pads on the second interposer 421.

The first module 410 and the second module 420 are then assembled together to construct the exemplary package structure 400, such as shown in FIG. 4A. For example, the first module 410 and the second module 420 are assembled by a process which comprises disposing the modules 410 and 420 adjacent to each other in a same plane, and causing tight tolerance-alignment of the first module 410 and the second module 420 by insertably fitting the fingers of the first and second alignment features 411-1 and 421-1 into the corresponding grooves of the first and second alignment features 411-1 and 421-1 and abutting the first and second meandering edges of the first and second interposers 411 and 421. This process causes tight tolerance-alignment of qubits on portions of the second quantum chip 413 (which do not overlap the first interposer 411), with signal transmission lines which are located on the grooves of the second alignment feature 421-1 and other regions of the surface of the second interposer 421 overlapped by the second quantum chip 413, and which are coupled to qubits on the quantum chip 422 on the second interposer 421.

Figure 5A:
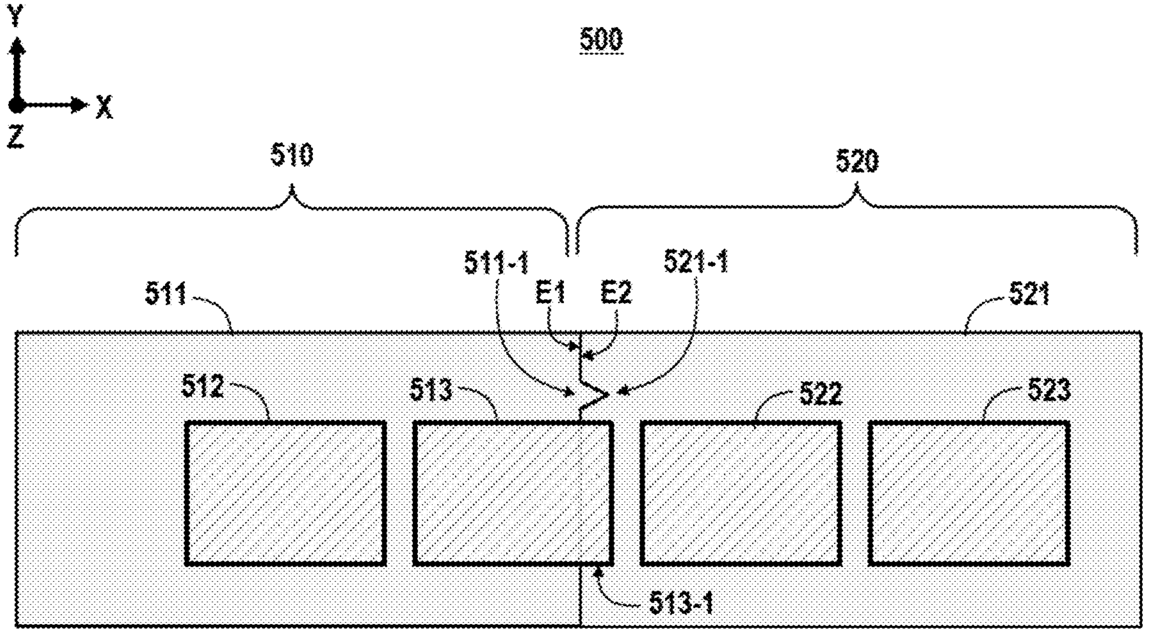
FIG. 5A schematically illustrates a modular package structure, according to another exemplary embodiment of the disclosure.

FIG. 5A schematically illustrates a modular package structure, according to another exemplary embodiment of the disclosure. More specifically, FIG. 5A is a schematic top view of a modular package structure 500 which comprises a plurality of quantum modules including a first module 510 and a second module 520. The first module 510 comprises a first interposer 511, and a first quantum chip 512 and a second quantum chip 513 bonded to a surface of the first interposer 511. The second module 520 comprises a first quantum chip 522 and a second quantum chip 523 bonded to a surface of the second interposer 521. The second quantum chip 513 of the first module 510 comprises an extended portion 513-1 which extends past an edge of the first interposer 511 and which is coupled to a region of the second interposer 521 which is overlapped by the extended portion 513-1 of the quantum chip 513.

FIG. 5A schematically illustrates an exemplary embodiment in which the first interposer 511 comprises a first alignment feature 511-1 formed on an edge E1 thereof, and the second interposer 521 comprises a corresponding second alignment feature 521-1 formed on an edge E2 thereof. The first alignment feature 511-1 comprises a tongue-like feature, and the second alignment feature 521-1 comprises a corresponding groove-like feature. In some embodiments, as shown in FIG. 5A, the first and second alignment features 511-1 and 521-1 comprise triangular or V-shaped features. The first alignment feature 511-1 is insertably fitted within the second alignment features 521-1 to interlock the first and second interposers 511 and 521 when the edges E1 and E2 are physically abutted, which causes the alignment of the one or more structures on the first interposer 511 with one or more structures on the second interposer 521, e.g., causes alignment of the extended portion 513-1 of the quantum chip 513 with bonding pads on the region of the second interposer 521 which is overlapped by the extended portion 513-1 of the quantum chip 513. It is to be noted that while the first and second alignment features 511-1 and 521-1 are shown as V-shaped features, in other embodiments, the first and second alignment features 511-1 and 521-1 can have other corresponding shapes, such as rectangular-shaped features, hemispherical-shaped features, etc.

Figure 5B:
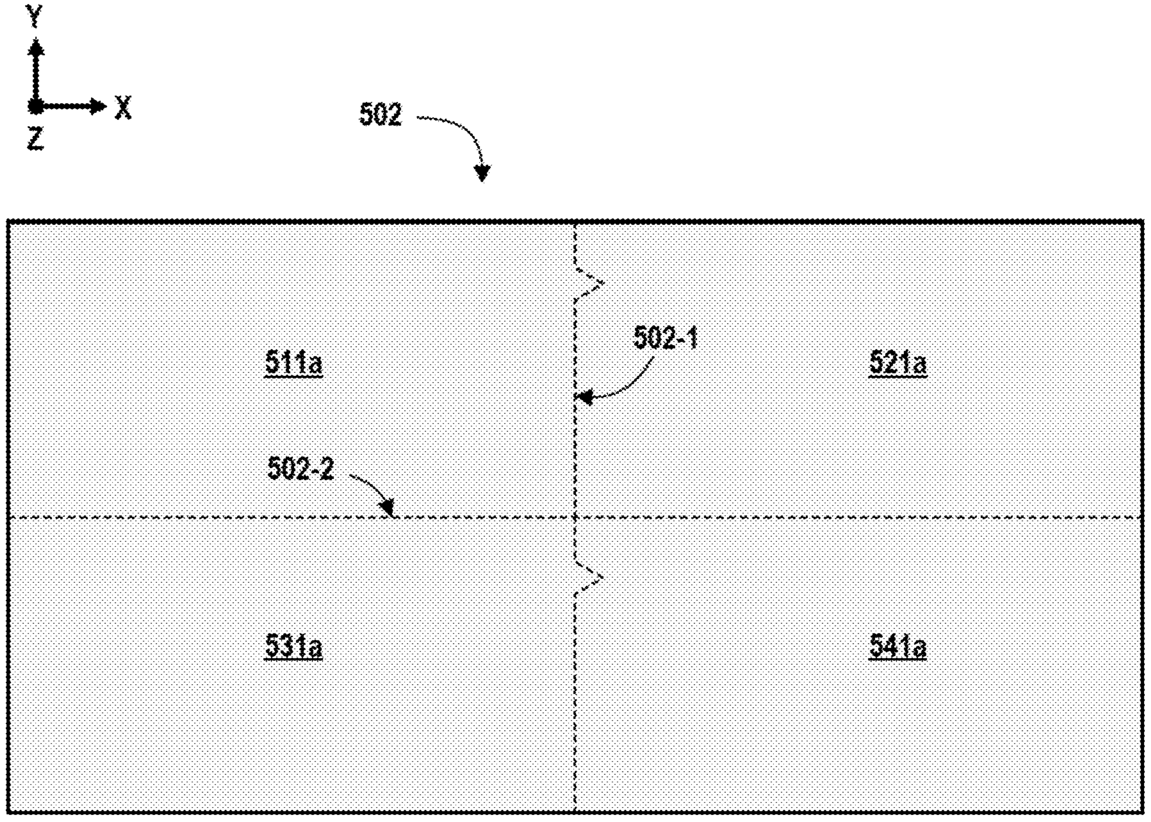
FIGS. 5B, 5C, and 5D schematically illustrate a method for constructing a modular package structure, according to another exemplary embodiment of the disclosure.
Figure 5C:
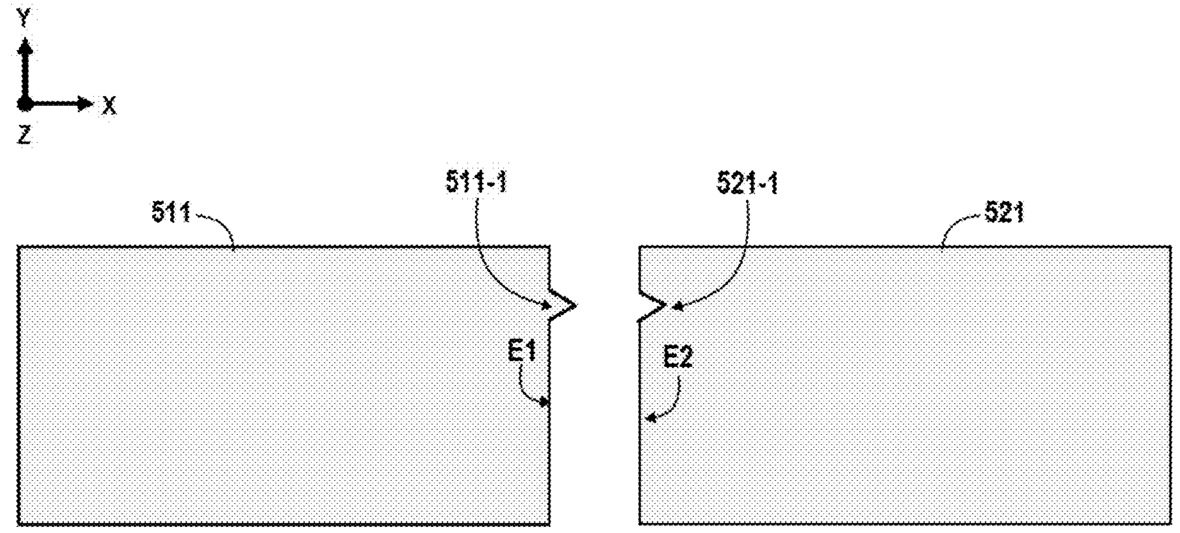
Figure 5D:
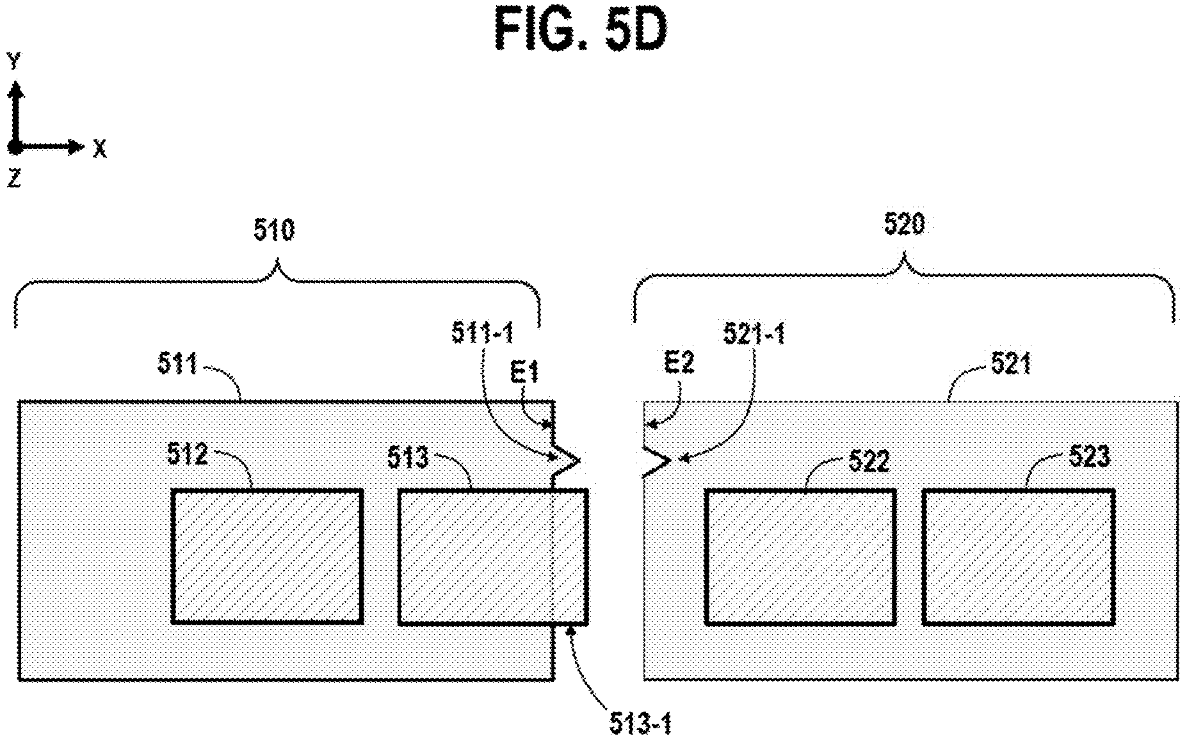

FIGS. 5B, 5C, and 5D schematically illustrate a method for constructing the modular package structure 500 of FIG. 5A, according to another exemplary embodiment of the disclosure. FIG. 5B schematically illustrates an initial phase of the fabrication process starting with a substrate 502 (e.g., a portion of a semiconductor wafer) that is segmented (or delineated) into a plurality of regions including regions 511*a*, 521*a*, 531*a*, and 541*a*, etc., based on dicing lines 502-1 and 502-2. For illustrative purposes, the regions 511*a* and 521*a* correspond to the respective first and second interposers 511 and 621. The substrate 502 may comprise a silicon substrate or other type of material as discussed above. A metallization process is performed to form patterned metallization structures on the surface of the substrate 502 in the different interposer regions 511*a*, 521*a*, 531*a*, and 541*a*, as desired for a given package design.

Next, FIG. 5C schematically illustrates a result of a dicing process in which the substrate 502 is cut along the dicing lines 502-1 and 502-2 to separate the interposers regions 511*a*, 521*a*, 531*a*, and 541*a*, etc. into singulated interposers including, e.g., the individual first and second interposers 511 and 521. The cutting along the dicing line 502-1 results in the formation of the first alignment feature 511-1 on the edge E1 of the first interposer 511, and the corresponding second alignment feature 521-1 on the edge E2 of the second interposer 521. The corresponding first and second alignment features 511-1 and 521-1 are concurrently formed as a result of the cutting the substrate 502 along the dicing line 502-1.

Next, FIG. 5D schematically illustrates a process of constructing the first and second quantum modules 510 and 520 by bonding one or more quantum chips to each of the singulated first and second interposers 511 and 521. In particular, in the exemplary embodiment of FIG. 5D, the first module 510 is formed by bonding the quantum chips 512 and 513 to the first interposer 511, with the extended portion 513-1 extending past the edge E1 of the first interposer. The second module 520 is formed by bonding the quantum chips 522 and 523 to the second interposer 521.

The first module 510 and the second module 520 are then assembled together to construct the exemplary package structure 500, such as shown in FIG. 5A. For example, the first module 510 and the second module 520 are assembled by a process which comprises disposing the modules 510 and 520 adjacent to each other in a same plane, and causing self-alignment of the first module 510 and the second module 520 via insertably fitting the first alignment features 511-1 into the second alignment feature 521-1 and abutting the edges E1 and E2 of the first and second interposers 511 and 521. This process causes tight-alignment of the qubits that are disposed on the extended portion 513-1 of second quantum chip 513, with, e.g., transmission lines that are located on a region of the second interposer 521 which is overlapped by the extended portion 513-1 of the quantum chip 513.

Figure 6A:
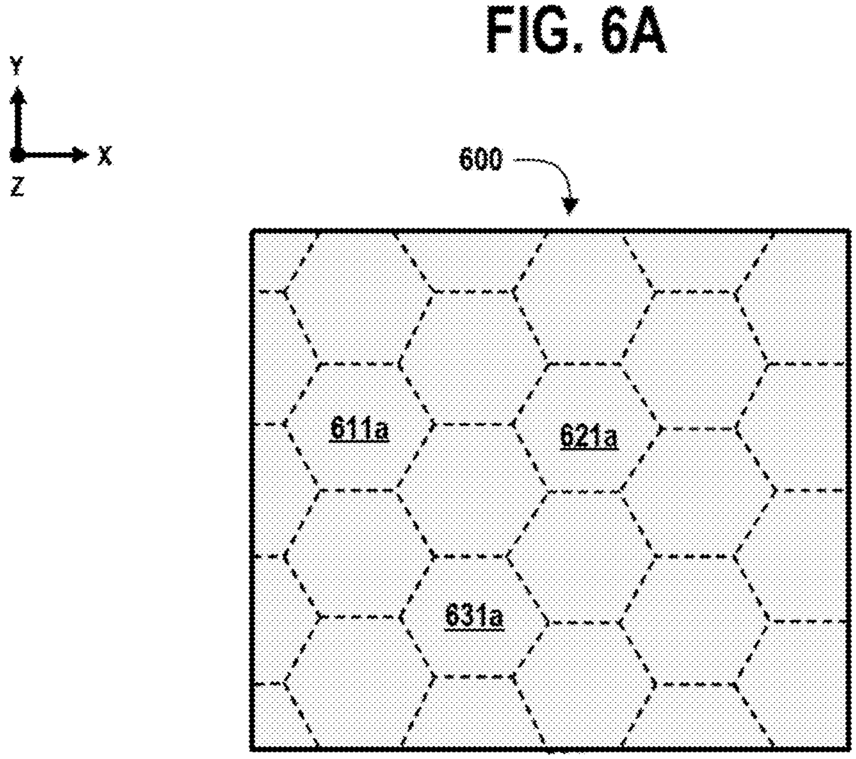
FIGS. 6A and 6B schematically illustrate a method for constructing interposers for modular package structures, according to an exemplary embodiment of the disclosure.
Figure 6B:
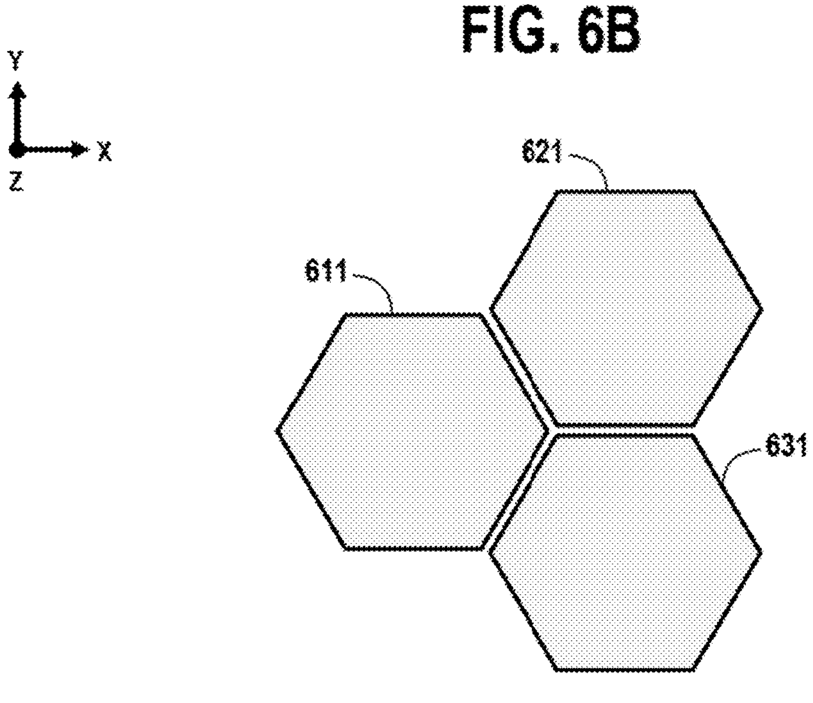

It is to be appreciated that other types of interposer patterns and shapes can be implemented to enable self-alignment in two orthogonal lateral directions (e.g., X and Y directions) by edge butting two or more interposers disposed in the same plane (e.g., X-Y plane), exemplary embodiments of which now be discussed in conjunction with FIGS. 6A, 6B, 7A, 7B, 8A, 8B, 9A, and 9B. In particular, FIGS. 6A and 6B schematically illustrate a method for constructing interposers for modular package structures, according to an exemplary embodiment of the disclosure. FIG. 6A schematically a substrate 600 (e.g., a portion of a semiconductor wafer) that is segmented (or delineated) into a plurality of interposer regions, e.g., interposer regions 611*a*, 621*a*, and 631*a*, etc., based on dicing lines (as indicated by dashed lines). The interposer regions each comprise a same size and shaped six-sided polygon (e.g., hexagon).

FIG. 6B schematically illustrates a result of a dicing process in which the semiconductor substrate 600 is cut along the dicing lines to separate the interposer regions into individual interposers. For example, FIG. 6B illustrates three individual interposers 611, 621, and 631 which correspond to the exemplary interposer regions 611*a*, 621*a*, and 631*a* in FIG. 6A. In this configuration, the three individual interposers 611, 621, and 631 can be utilized to form a modular package structure wherein self-alignment is achieved in the X and Y directions by abutting edges of the three individual interposers 611, 621, and 631 as shown. In this regard, the hexagon-shaped interposers enable tight tolerance-alignment of quantum modules using at least three hexagon-shaped interposers (e.g., interposers 611, 621, and 631), as shown in FIG. 6B, to achieve a tight tolerance-aligned interlocking pattern of interposers.

Figure 7A:
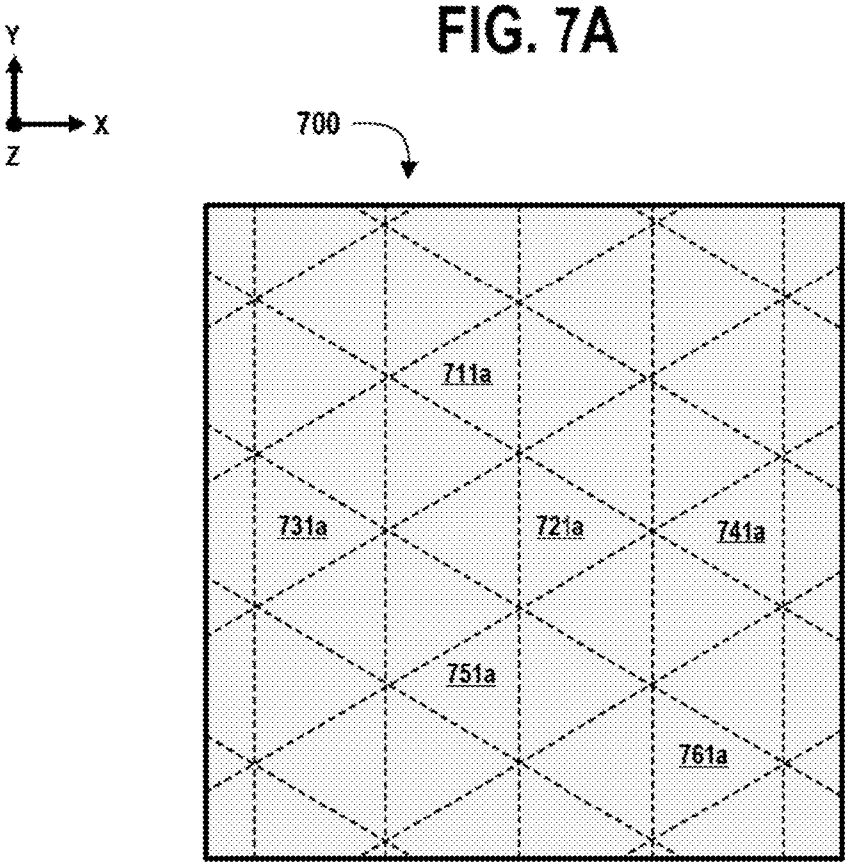
FIGS. 7A and 7B schematically illustrate a method for constructing interposers for modular package structures, according to another exemplary embodiment of the disclosure.
Figure 7B:
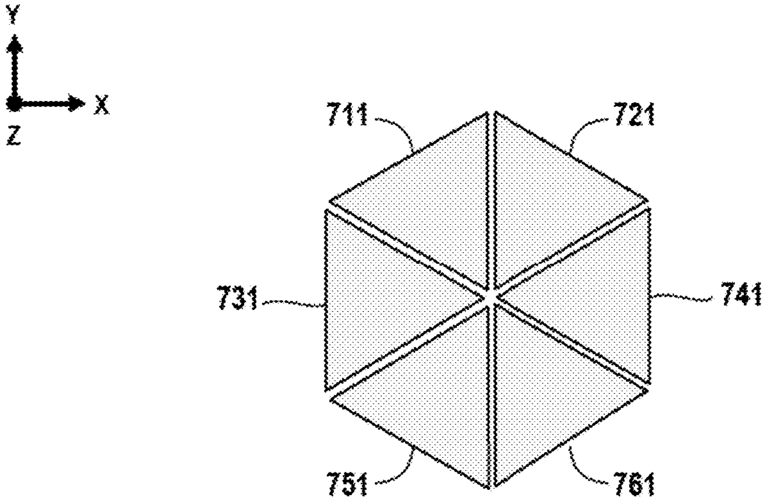

Next, FIGS. 7A and 7B schematically illustrate a method for constructing interposers for modular package structures, according to an exemplary embodiment of the disclosure. In particular, FIG. 7A schematically a semiconductor substrate 700 (e.g., a portion of a semiconductor wafer) that is segmented (or delineated) into a plurality of interposer regions, e.g., interposer regions 711*a*, 721*a*, 731*a*, 741*a*, 751*a*, 761*a*, etc., based on dicing lines (as indicated by dashed lines). The interposer regions each comprise a same size and triangular-shaped region.

FIG. 7B schematically illustrates a result of a dicing process in which the substrate 700 is cut along the dicing lines to separate the interposer regions into individual interposers. For example, FIG. 7B shows six individual triangular-shaped interposers 711, 721, 731, 741, 751, and 761 which correspond to the exemplary interposer regions 711*a*, 721*a*, 731*a*, 741*a*, 751*a*, and 761*a* in FIG. 7A. In this configuration, the six individual interposers 711, 721, 731, 741, 751, and 761 can be utilized to form a modular package structure wherein self-alignment is achieved in the X and Y directions by abutting edges of the six individual interposers 711, 721, 731, 741, 751, and 761 as shown. In this regard, the triangular-shaped interposers enable tight tolerance-alignment of quantum modules using at least six triangular-shaped interposers 711, 721, 731, 741, 751, and 761, as shown in FIG. 7B, to achieve a tight tolerance-aligned interlocking pattern of interposers.

Figure 8A:
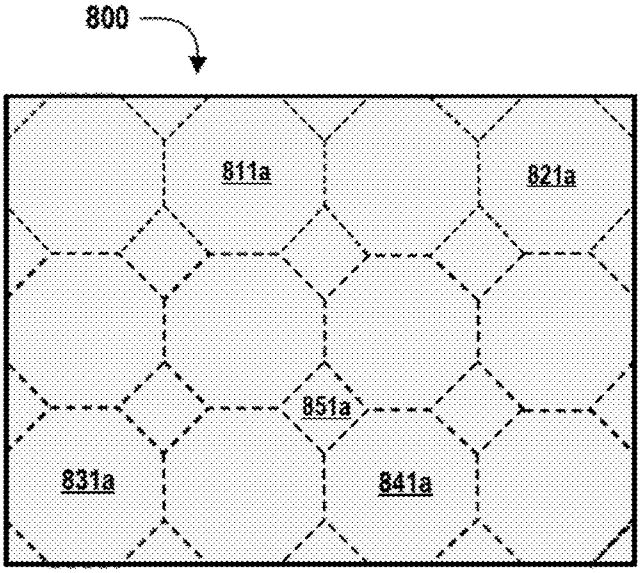
FIGS. 8A and 8B schematically illustrate a method for constructing interposers for modular package structures, according to another exemplary embodiment of the disclosure.
Figure 8B:
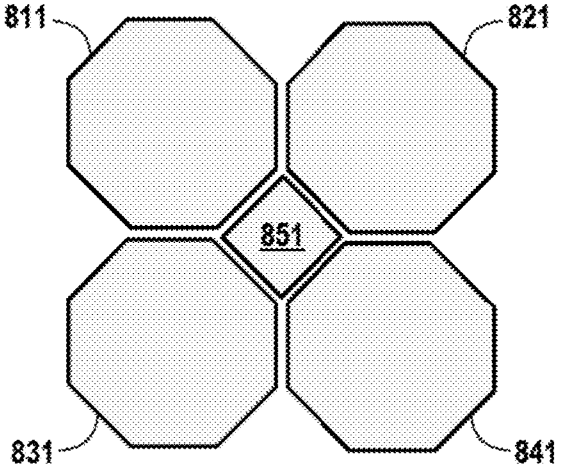

Next, FIGS. 8A and 8B schematically illustrate a method for constructing interposers for modular package structures, according to an exemplary embodiment of the disclosure. In particular, FIG. 8A schematically a substrate 800 (e.g., a portion of a semiconductor wafer) that is segmented (or delineated) into a plurality of interposer regions, e.g., interposer regions 811*a*, 821*a*, 831*a*, 841*a*, 851*a*, etc., based on dicing lines (as indicated by dashed lines). A first plurality of the interposer regions (e.g., regions 811*a*, 821*a*, 831*a*, 841*a*) each comprise a same size and shaped eight-sided polygon (e.g., octagon), and a second plurality of the interposer regions (e.g., region 851*a*) comprise a same size and square-shaped interposer region.

Figure 9A:
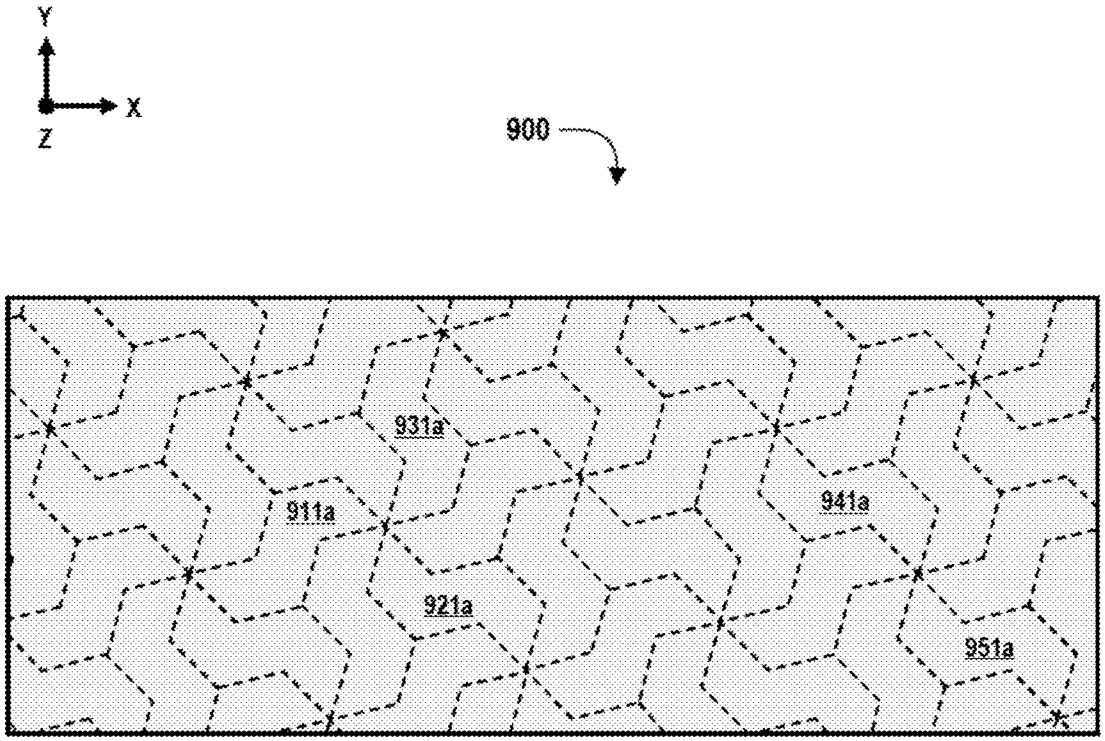
FIGS. 9A, 9B, and 9C schematically illustrate a method for constructing interposers for modular package structures, according to another exemplary embodiment of the disclosure.
Figure 9B:
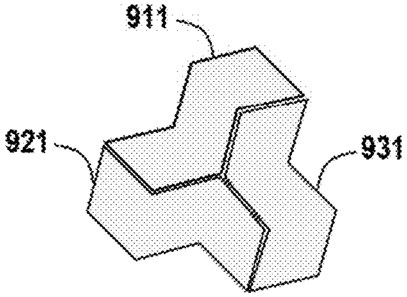
Figure 9C:
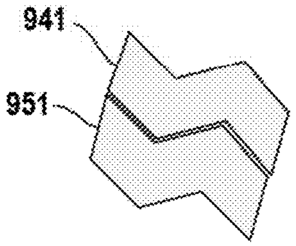

FIG. 8B schematically illustrates a result of a dicing process in which the semiconductor substrate 800 is cut along the dicing lines to separate the interposer regions into individual interposers. For example, FIG. 8B shows four individual octagon-shaped interposers 811, 821, 831, and 841 which correspond to the exemplary interposer regions 811*a*, 821*a*, 831*a*, and 841*a* in FIG. 8A, and a square-shaped interposer 851 which corresponds to the interposer region 851*a*. In this configuration, the five individual interposers 811, 821, 831, 841, and 851 can be utilized to form a modular package structure wherein self-alignment is achieved in the X and Y directions by abutting edges of the five individual interposers 811, 821, 831, 841, and 851 as shown. In this regard, the different shaped interposers enable tight tolerance-alignment of quantum modules using at least four octagon-shaped interposers 811, 821, 831, and 841, and one square-shaped interposer 851, as shown in FIG. 8B, to achieve a tight tolerance-aligned interlocking pattern of interposers Next, FIGS. 9A, 9B, and 9C schematically illustrate a method for constructing interposers for modular package structures, according to another exemplary embodiment of the disclosure. In particular, FIG. 9A schematically a semiconductor substrate 900 (e.g., a portion of a semiconductor wafer) that is segmented (or delineated) into a plurality of interposer regions, e.g., interposer regions 911*a*, 921*a*, 931*a*, 941*a*, 951*a*, etc., based on dicing lines (as indicated by dashed lines). The interposer regions each comprise a same size and herringbone-shaped region.

FIG. 9B schematically illustrates a result of a dicing process in which the substrate 900 is cut along the dicing lines to separate the interposer regions into individual interposers. For example, FIG. 9B illustrates three individual interposers 911, 921, and 931 which correspond to the exemplary interposer regions 911*a*, 921*a*, and 931*a* in FIG. 9A. In this configuration, the three individual interposers 911, 921, and 931 can be utilized to form a modular package structure wherein self-alignment is achieved in the X and Y directions by abutting edges of the three individual interposers 911, 921, and 931 as shown. Further, FIG. 9C schematically illustrates an alternate embodiment in which two individual interposers 941 and 951 (which correspond to the exemplary interposer regions 941*a* and 951*a* in FIG. 9A) can be utilized to form a modular package structure wherein self-alignment is achieved in the X and Y directions by abutting edges of the two individual interposers 941 and 951 as shown. In this regard, the herringbone-shaped interposers enable tight tolerance-alignment of quantum modules using at least two interposers, e.g., interposers 911 and 921 (FIG. 9B), and interposers 941 and 951 (FIG. 9C) to achieve a tight tolerance-aligned interlocking pattern of interposers.

Figure 10:
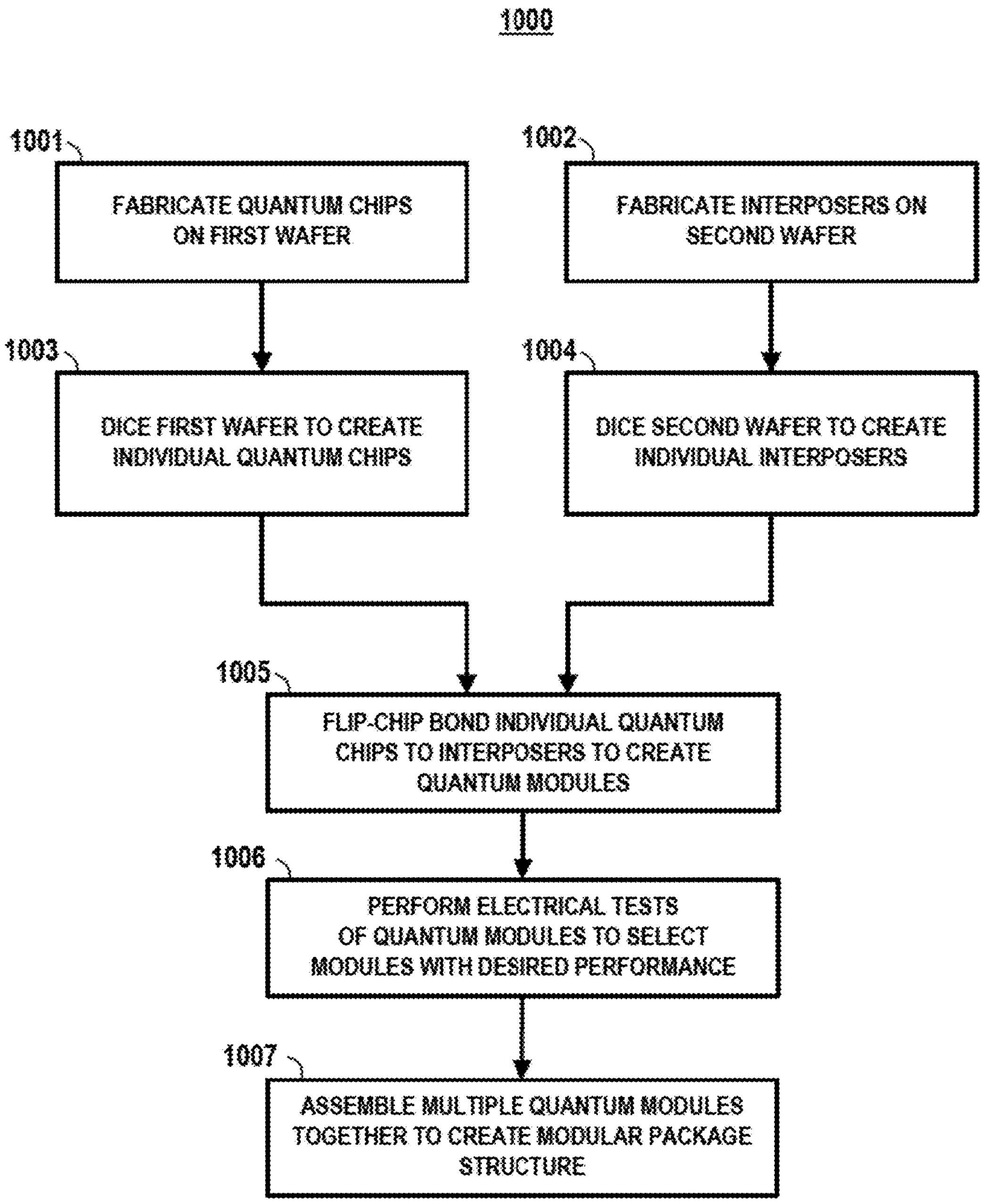
FIG. 10 illustrates a flow diagram of a method for constructing modular package structures, according to an exemplary embodiment of the disclosure.

The exemplary modular package structures discussed herein can be fabricated using state of the art semiconductor fabrication technologies. For example, FIG. 10 illustrates a flow diagram of a method 1000 for constructing modular package structures, according to an exemplary embodiment of the disclosure. A plurality of quantum chips are fabricated on a first semiconductor wafer (quantum chip wafer) (block 1001), and a plurality of interposers are fabricated on a second semiconductor wafer (interposer wafer) (block 1002). For example, on the quantum chip wafer, various quantum bit dies are fabricated, with each quantum bit die comprising various components such as superconducting qubits, tunable couplers, ground planes, signal coplanar waveguides, coupler drive lines, qubit drive lines, readout resonators, coupling capacitor pads, coupling inductors, solder bump bond pads, etc., by lithographically defined patterns of superconducting materials formed on the qubit wafer, which are formed using by, e.g., deposition, optical lithography, etch, and liftoff steps.

In addition, on a given interposer wafer, various interposer regions (or interposer dies) are fabricated as discussed above, with each interposer die comprising various components such as wiring for signal I/O, ground planes, solder bump bond pads, and package I/O routing and interconnect transmission lines and bond pads, etc., which comprise lithographically defined patterns of superconducting materials formed on the interposer wafer, which are formed using by, e.g., deposition, optical lithography, etch, and liftoff steps. The metallization on the interposer and quantum chip wafers can be formed using various types of superconductor materials that are suitable for a given application, including, but not limited to, elementary metals such as niobium (Nb), aluminum (Al), tantalum (Ta), and compounds such as titanium nitride (TiN), niobium nitride (NbN), niobium titanium nitride (NbTiN), etc.

The first semiconductor wafer is diced to create individual quantum chips (or individual quantum bit dies) (block 1003), and the second semiconductor wafer is diced to create individual interposers (block 1004). One or more quantum chips are then flip-chip bonded to each of plurality of the interposers to create quantum modules (block 1005), as discussed above. In some embodiments, flip-chip bonding a given quantum chip to a given interposer is performed by depositing and patterning indium solder bumps onto the given interposer, and then flip-chip bonding the given quantum chip to the given interposer using, e.g., a thermo-compression bonding process to create galvanic connections between the quantum chip and the interposer.

Next, electrical tests are performed on the individual quantum modules to determine and select modules that function as intended and a desired performance (block 1006). The electrical tests can include tests that are performed at room temperature. In addition, the electrical tests can be performed at cryogenic temperatures in a cryostat (e.g., dilution refrigeration system) to test the functionality of the superconducting qubits and other superconducting quantum components on the quantum chips. The selected individual quantum modules are then used to form modular package structures (block 1007), wherein a given modular package structure is constructed by assembling two or more individual quantum modules together as discussed above where self-alignment of the quantum modules is achieved by utilizing the alignment features of the corresponding interposers.

Figure 11:
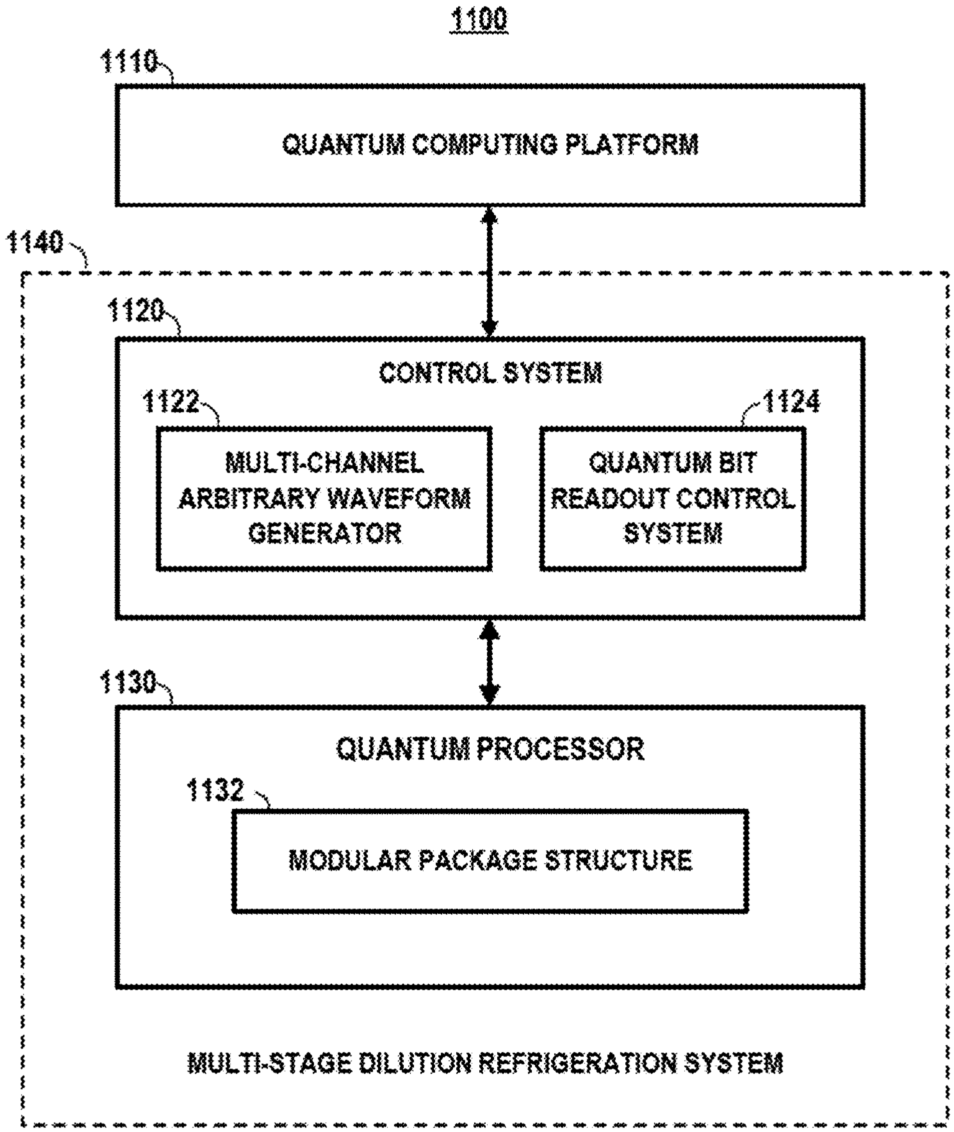
FIG. 11 schematically illustrates a quantum computing system comprising a quantum processor which comprises a modular package structure that is constructed using multiple quantum modules, according to an exemplary embodiment of the disclosure.

FIG. 11 schematically illustrates a quantum computing system comprising a quantum processor which comprises a modular package structure that is constructed using multiple quantum modules, according to an exemplary embodiment of the disclosure. In particular, FIG. 11 schematically illustrates a quantum computing system 1100 which comprises a quantum computing platform 1110, a control system 1120, and a quantum processor 1130. In some embodiments, the control system 1120 comprises a multi-channel arbitrary waveform generator (AWG) 1122, and a quantum bit readout control system 1124. In an exemplary embodiment, the quantum processor 1130 comprises at least one modular package structure 1132, which can be implemented using any one of the exemplary modular package structures as discussed above, as may be desired for a given application or quantum system configuration.

In some embodiments, the control system 1120 and the quantum processor 1130 are disposed in a dilution refrigeration system 1140 which can generate cryogenic temperatures that are sufficient to operate components of the control system 1120 for quantum computing applications. For example, the quantum processor 1130 may need to be cooled down to near-absolute zero, e.g., 10-15 millikelvin (mK), to allow the superconducting qubits to exhibit quantum behaviors. In some embodiments, the dilution refrigeration system 1140 comprises a multi-stage dilution refrigerator where the components of the control system 1120 can be maintained at different cryogenic temperatures, as needed. For example, while the quantum processor 1130 may need to be cooled down to, e.g., 10-15 mK, the circuit components of the control system 1120 may be operated at cryogenic temperatures greater than 10-15 mK, depending on the configuration of the quantum computing system. In other embodiments, some or all of the components of the control system 1120 may comprise electronic components that are disposed and operated in room temperature environment.

In some embodiments, the multi-channel AWG 1122 and other suitable microwave pulse signal generators are configured to generate the microwave control pulses that are applied to the qubit drive lines, and the coupler drive lines to control the operation of the superconducting qubits and associated qubit coupler circuitry, when performing various gate operations to execute a given certain quantum information processing algorithm. In some embodiments, the multi-channel AWG 1122 comprises a plurality of AWG channels, which control respective superconducting qubits on quantum chips within the modular package structure 1132 of the quantum processor 1130. In some embodiments, each AWG channel comprises a baseband signal generator, a digital-to-analog converter (DAC) stage, a filter stage, a modulation stage, and an impedance matching network, and a phase-locked loop system to generate local oscillator (LO) signals (e.g., quadrature LO signals LO_I and LO_Q) for the respective modulation stages of the respective AWG channels.

In some embodiments, the multi-channel AWG 1122 comprises a quadrature AWG system which is configured to process quadrature signals, wherein a quadrature signal comprises an in-phase (I) signal component, and a quadrature-phase (Q) signal component. In each AWG channel the baseband signal generator is configured to receive baseband data as input (e.g., from the quantum computing platform), and generate digital quadrature signals I and Q which represent the input baseband data. In this process, the baseband data that is input to the baseband signal generator for a given AWG channel is separated into two orthogonal digital components including an in-phase (I) baseband component and a quadrature-phase (Q) baseband component. The baseband signal generator for the given AWG channel will generate the requisite digital quadrature baseband IQ signals which are needed to generate an analog waveform (e.g., sinusoidal voltage waveform) with a target center frequency that is configured to operate or otherwise control one or more quantum bits that are coupled to the output of the given AWG channel.

The DAC stage for the given AWG channel is configured to convert a digital baseband signal (e.g., a digital IQ signal output from the baseband signal generator) to an analog baseband signal (e.g., analog baseband signals I(t) and Q(t)) having a baseband frequency. The filter stage for the given AWG channel is configured to the filter the IQ analog signal components output from the DAC stage to thereby generate filtered analog IQ signals. The modulation stage for the given AWG channel is configured to perform analog IQ signal modulation (e.g., single-sideband (SSB) modulation) by mixing the filtered analog signals I(t) and Q(t), which are output from the filter stage, with quadrature LO signals (e.g., an in-phase LO signal (LO_I) and a quadrature-phase LO signal (LO_Q)) to generate and output an analog RF signal (e.g., a single-sideband modulated RF output signal).

In some embodiments, the quantum bit readout control system 1124 comprises a microwave pulse signal generator that is configured to applying a microwave tone to a given readout resonator line of a given superconducting qubit to perform a readout operation to readout the state of the given superconducting qubit, as well as circuitry that is configured to process the readout signal generated by the readout resonator line to determine the state of the given superconducting qubit, using techniques known to those of ordinary skill in the art. For example, in some embodiments, a qubit readout line for a given qubit comprise a coplanar waveguide resonator that is configured to have a resonant frequency that is detuned from a transition frequency of the given qubit to enable a dispersive readout operation for reading the quantum state of a given qubit which is coupled to a given readout resonator. A dispersive readout operation involves applying an RF readout control signal (RF_RO) to the given readout resonator, and detecting/processing the readout signal that is reflected out from the given readout resonator. An RF readout control signal that is applied to the given readout resonator has a single frequency tone that is the same or similar to the resonant frequency of the readout resonator, a pulse envelope with a given pulse shape (e.g., gaussian pulse envelope), and given pulse duration. In the dispersive regime of qubit-resonator coupling, the RF readout control signal interacts with the given qubit/resonator system, and the resulting output readout signal which is reflected out from the given readout resonator comprises information (e.g., phase and/or amplitude) that is qubit-state dependent.

The quantum computing platform 1110 comprises a software and hardware platform which comprises various software layers that are configured to perform various functions, including, but not limited to, generating and implementing various quantum applications using suitable quantum programming languages, configuring and implementing various quantum gate operations, compiling quantum programs into a quantum assembly language, implementing and utilizing a suitable quantum instruction set architecture (ISA), etc. In addition, the quantum computing platform 1110 comprises a hardware architecture of processors, memory, etc., which is configured to control the execution of quantum applications, and interface with the control system 1120 to (i) generate digital control signals that are converted to analog microwave control signals by the control system 1120, to control operations of the quantum processor 1130 when executing a given quantum application, and (ii) to obtain and process digital signals received from the control system 1120, which represent the processing results generated by the quantum processor 1130 when executing various gate operations for a given quantum application.

In some exemplary embodiments, the quantum computing platform 1110 of the quantum computing system 1100 may be implemented using any suitable computing system architecture which is configured to implement methods to support quantum computing operations by executing computer readable program instructions that are embodied on a computer program product which includes a computer readable storage medium (or media) having such computer readable program instructions thereon for causing a processor to perform control methods as discussed herein.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A package structure, comprising:
a first interposer comprising a first alignment feature;
a second interposer comprising a second alignment feature; and
a quantum chip bonded to the first interposer with an extended portion of the quantum chip extending past a first edge of the first interposer;
wherein the first interposer and the second interposer are disposed with the first alignment feature engaging with the second alignment feature to cause alignment and coupling of one or more components on the extended portion of the quantum chip with one or more components on the second interposer.

2. The package structure of claim 1, wherein:
the first interposer and the second interposer are disposed in a plane; and
the first alignment feature engaging with the second alignment feature causes the alignment in first and second orthogonal directions of the plane.

3. The package structure of claim 1, wherein:
the first alignment feature comprises the first edge of the first interposer;
the second alignment feature comprises a second edge of the second interposer; and
the first alignment feature engaging with the second alignment feature comprises the first edge and the second edge being abutted to cause the alignment and coupling of the one or more components on the extended portion of the quantum chip with the one or more components on the second interposer.

4. The package structure of claim 1, wherein the first alignment feature is fitted within the second alignment feature to cause the alignment and coupling of the one or more components on the extended portion of the quantum chip with the one or more components on the second interposer.

5. The package structure of claim 1, wherein:
the first alignment feature comprises a groove feature;
the second alignment feature comprises a tongue feature, and
the second alignment feature is fitted within the first alignment feature to cause the alignment and coupling of the one or more components on the extended portion of the quantum chip with the one or more components on the second interposer.

6. The package structure of claim 5, wherein the groove feature and the tongue feature comprise corresponding V-shaped features.

7. The package structure of claim 1, wherein:
the first alignment feature comprises a first pattern of alignment features;
the second alignment feature comprises a second pattern of alignment features; and
the first pattern of alignment features and the second pattern of alignment features are interdigitated to cause the alignment and coupling of the one or more components on the extended portion of the quantum chip with the one or more components on the second interposer.

8. A package structure, comprising:
a first interposer comprising a first edge;
a second interposer comprising a second edge; and
a quantum chip bonded to the first interposer with an extended portion of the quantum chip extending past the first edge of the first interposer;
wherein the first interposer and the second interposer are disposed in a plane with the first edge and the second edge abutted to cause alignment and coupling of one or more components on the extended portion of the quantum chip with one or more components on the second interposer.

9. The package structure of claim 8, wherein the first edge and the second edge are abutted to cause the alignment in first and second orthogonal directions of the plane.

10. The package structure of claim 8, wherein:
the first interposer comprises a first shape defined at least in part by the first edge;
the second interposer comprises a second shape defined at least in part by the second edge; and
the first shape and the second shape are different shapes.

11. The package structure of claim 8, wherein:
the first interposer comprises a first shape defined at least in part by the first edge;
the second interposer comprises a second shape defined at least in part by the second edge; and
the first shape and the second shape are the same shape.

12. The package structure of claim 8, wherein:

the second interposer comprises a second quantum chip;

the one or more components on the second interposer comprise transmission lines coupled to the second quantum chip; and the one or more components on the extended portion of the quantum chip comprise one or more quantum bits.

13. The package structure of claim 8, further comprising a third interposer comprising a third edge, wherein:

the first interposer comprises a second edge;

the quantum chip is bonded to the first interposer with a second extended portion of the quantum chip extending past the second edge of the first interposer;

the third interposer is disposed on the plane with the first interposer and the second interposer; and the second edge of the first interposer and the third edge of the third interposer are abutted to cause alignment and coupling of one or more components on the second extended portion of the quantum chip with one or more components on the third interposer.

14. The package structure of claim 13, wherein:

the first interposer comprises a first shape defined at least in part by the first edge and the second edge of the first interposer;

the second interposer comprises a second shape defined at least in part by the second edge of the second interposer;

the third interposer comprises a third shape defined at least in part by the third edge of the third interposer; and the first shape, the second shape, and the third shape are the same shape.

15. The package structure of claim 13, wherein:

the first interposer comprises a first shape defined at least in part by the first edge and the second edge of the first interposer;

the second interposer comprises a second shape defined at least in part by the second edge of the second interposer;

the third interposer comprises a third shape defined at least in part by the third edge of the third interposer;

the second shape and the third shape are the same shape; and the first shape is different from the second shape and the third shape.

16. The package structure of claim 13, wherein:

the third interposer comprises a third quantum chip;

the one or more components on the third interposer comprise transmission lines coupled to the third quantum chip; and the one or more components on the second extended portion of the quantum chip comprise one or more quantum bits.

17. A package structure, comprising:

a first module comprising a first interposer which comprises a first edge, and a first quantum chip bonded to the first interposer with an extended portion of the first quantum chip extending past the first edge of the first interposer; and a second module comprising a second interposer which comprises a second edge, a second quantum chip bonded to the second interposer, and transmission lines disposed on the second interposer and coupled to the second quantum chip;

wherein the first interposer and the second interposer are disposed in a plane with the first edge and the second edge abutted to cause alignment and coupling of one or more components on the extended portion of the first quantum chip with one or more of the transmission lines on the second interposer which are coupled to the second quantum chip.

18. The package structure of claim 17, wherein the first edge and the second edge are abutted to cause the alignment in first and second orthogonal directions of the plane.

19. The package structure of claim 17, wherein:

the first interposer comprises a first shape defined at least in part by the first edge;

the second interposer comprises a second shape defined at least in part by the second edge; and the first shape and the second shape are one of different shapes and the same shape.

20. The package structure of claim 17, wherein the first module further comprises a third quantum chip bonded to the first interposer, and transmission lines disposed on the first interposer which couple the first quantum chip and the third quantum chip.

21. A method, comprising:

forming interposers on a substrate; and cutting the substrate to separate the interposers into at least a first interposer comprising a first edge, and a second interposer comprising a second edge;

wherein the first edge and the second edge are configured to cause alignment of structures on the first interposer with structures on the second interposer when the first edge and the second edge are abutted with the first interposer and the second interposer disposed in a plane.

22. The method of claim 21, wherein:

the first interposer comprises a first shape defined at least in part by the first edge;

the second interposer comprises a second shape defined at least in part by the second edge; and the first shape and the second shape are different shapes.

23. The method of claim 21, wherein:

the first interposer comprises a first shape defined at least in part by the first edge;

the second interposer comprises a second shape defined at least in part by the second edge; and the first shape and the second shape are the same shape.

24. A method, comprising:

constructing a first module comprising a first interposer which comprises a first edge, and a first quantum chip bonded to the first interposer with an extended portion of the first quantum chip extending past the first edge of the first interposer;

constructing a second module comprising a second interposer which comprises a second edge, a second quantum chip bonded to the second interposer, and transmission lines disposed on the second interposer and coupled to the second quantum chip; and assembling the first module and the second module with the first interposer and the second interposer are disposed in a plane with the first edge and the second edge abutted to cause alignment and coupling of one or more components on the extended portion of the first quantum chip with one or more of the transmission lines on the second interposer which are coupled to the second quantum chip.

25. The method of claim 24, wherein:

the first interposer comprises a first shape defined at least in part by the first edge;

the second interposer comprises a second shape defined at least in part by the second edge; and the first shape and the second shape are one of different shapes and the same shape.

* * * * *